(12) United States Patent
Kulick et al.

(10) Patent No.: US 10,325,875 B2
(45) Date of Patent: Jun. 18, 2019

(54) EDGE INTERCONNECT PACKAGING OF INTEGRATED CIRCUITS FOR POWER SYSTEMS

(71) Applicant: Indiana Integrated Circuits, LLC, South Bend, IN (US)

(72) Inventors: Jason M. Kulick, South Bend, IN (US); Douglas Hopkins, Cary, NC (US)

(73) Assignees: North Carolina State University, Raleigh, NC (US); Indiana Integrated Circuits, LLC, South Bend, IN (US)

( * ) Notice: Subject to any disclaimer, the term of this patent is extended or adjusted under 35 U.S.C. 154(b) by 34 days.

(21) Appl. No.: 15/325,197

(22) PCT Filed: Jul. 17, 2015

(86) PCT No.: PCT/US2015/040862
§ 371 (c)(1),
(2) Date: Jan. 10, 2017

(87) PCT Pub. No.: WO2016/011325
PCT Pub. Date: Jan. 21, 2016

(65) Prior Publication Data
US 2017/0162532 A1    Jun. 8, 2017

Related U.S. Application Data

(60) Provisional application No. 62/026,260, filed on Jul. 18, 2014.

(51) Int. Cl.
*H01L 25/065* (2006.01)
*H01L 23/00* (2006.01)
(Continued)

(52) U.S. Cl.
CPC .......... *H01L 24/32* (2013.01); *H01L 23/3185* (2013.01); *H01L 23/36* (2013.01);
(Continued)

(58) Field of Classification Search
CPC ............ H01L 2224/32137; H01L 2224/32147
See application file for complete search history.

(56) References Cited

U.S. PATENT DOCUMENTS 7,612,443 B1 * 11/2009 Bernstein ................ H01L 23/60
257/685
8,623,700 B1    1/2014 Bernstein et al.
(Continued)

OTHER PUBLICATIONS

Zhang et al., Improvement of a Vertical Thin Film Transistor Based on Low-Temperature Polycrystalline Silicon Technology by Introduction of an Oxide Barrier between Drain and Source Layers, ECS Transactions, 2012, vol. 49, pp. 491-496.

*Primary Examiner* — Cory W Eskridge
(74) *Attorney, Agent, or Firm* — The Webb Law Firm

(57) ABSTRACT

Disclosed is an integrated circuit packaging system that includes first and second microchips. Each microchip includes a top surface, a surface, one or more quilt package nodules fabricated on said top surface, and one or more bottom surface connectors. The system also includes a substrate to which the first and second microchips are mounted. The first and second microchips are connected via the quilt package nodules.

20 Claims, 26 Drawing Sheets

(51) Int. Cl.
　　　　H01L 23/36　　　　(2006.01)
　　　　H01L 23/373　　　(2006.01)
　　　　H01L 29/06　　　　(2006.01)
　　　　H01L 23/31　　　　(2006.01)
　　　　H01L 23/498　　　(2006.01)
　　　　H01L 21/56　　　　(2006.01)

(52) U.S. Cl.
　　　　CPC .... H01L 23/3735 (2013.01); H01L 23/49838 (2013.01); H01L 24/00 (2013.01); H01L 24/16 (2013.01); H01L 24/48 (2013.01); H01L 24/73 (2013.01); H01L 25/065 (2013.01); H01L 25/0652 (2013.01); H01L 25/0655 (2013.01); H01L 29/0657 (2013.01); H01L 21/563 (2013.01); H01L 2224/05014 (2013.01); H01L 2224/05554 (2013.01); H01L 2224/16225 (2013.01); H01L 2224/16227 (2013.01); H01L 2224/32137 (2013.01); H01L 2224/32147 (2013.01); H01L 2224/32225 (2013.01); H01L 2224/48091 (2013.01); H01L 2224/48227 (2013.01); H01L 2224/73204 (2013.01); H01L 2224/73207 (2013.01); H01L 2224/73257 (2013.01); H01L 2924/00014 (2013.01); H01L 2924/13055 (2013.01); H01L 2924/13091 (2013.01)

(56) References Cited

U.S. PATENT DOCUMENTS

2012/0187577 A1\* 7/2012 Cordes ................ H01L 21/6835
　　　　　　　　　　　　　　　　　　　　　　　　　　　　257/777
2014/0268592 A1　　9/2014 Kulick et al.

\* cited by examiner

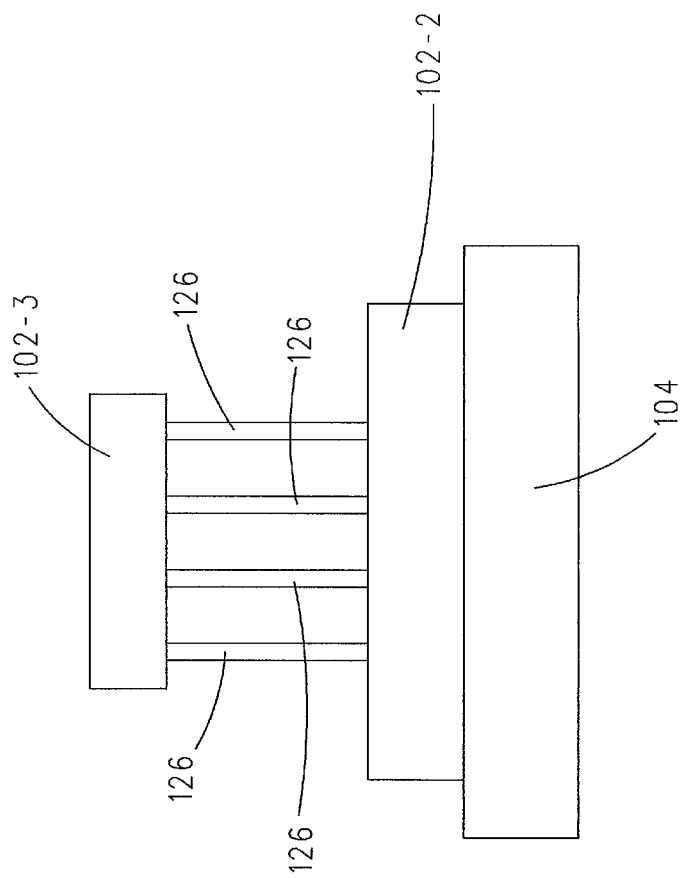

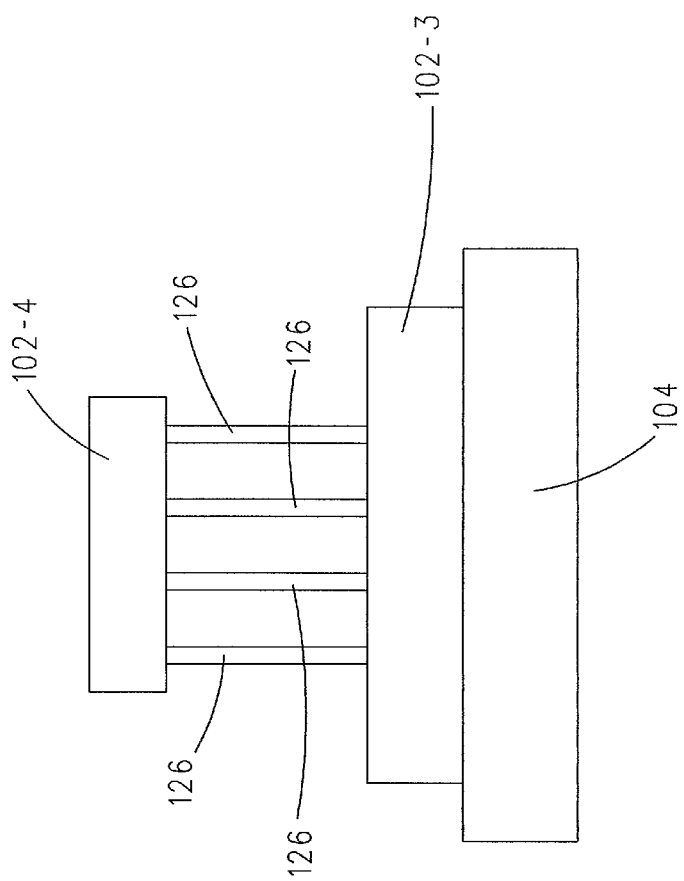

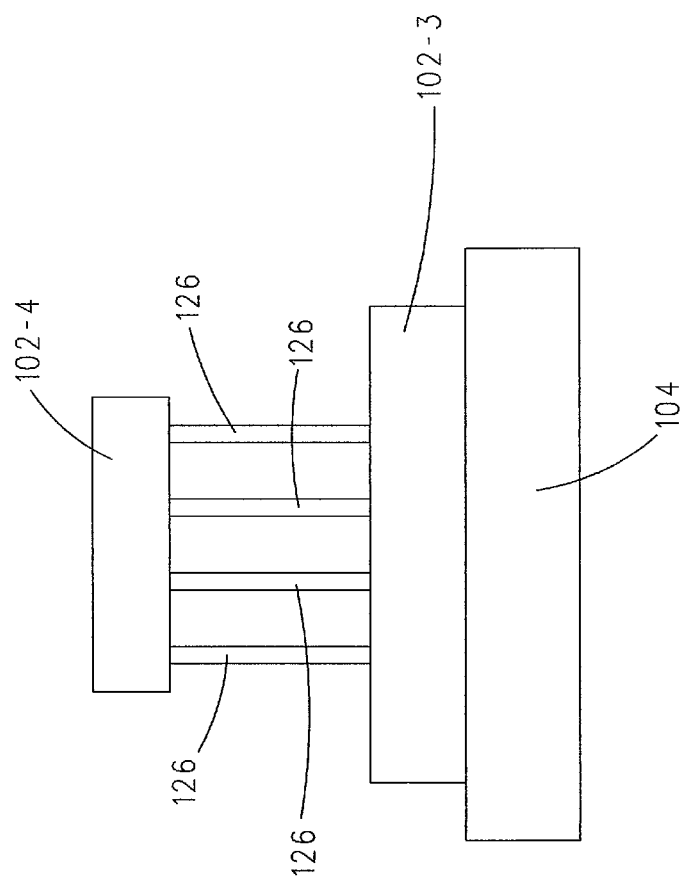

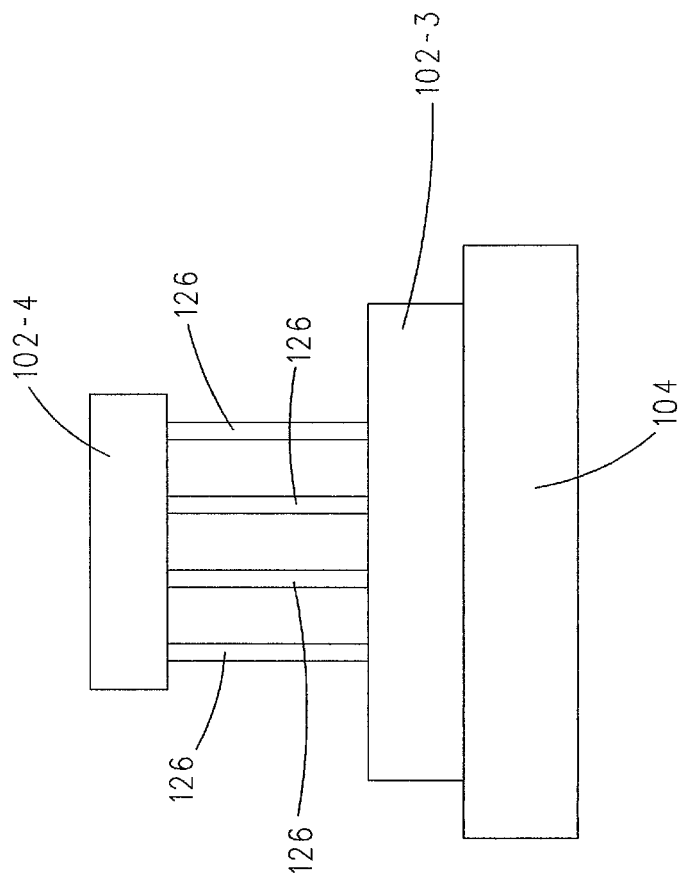

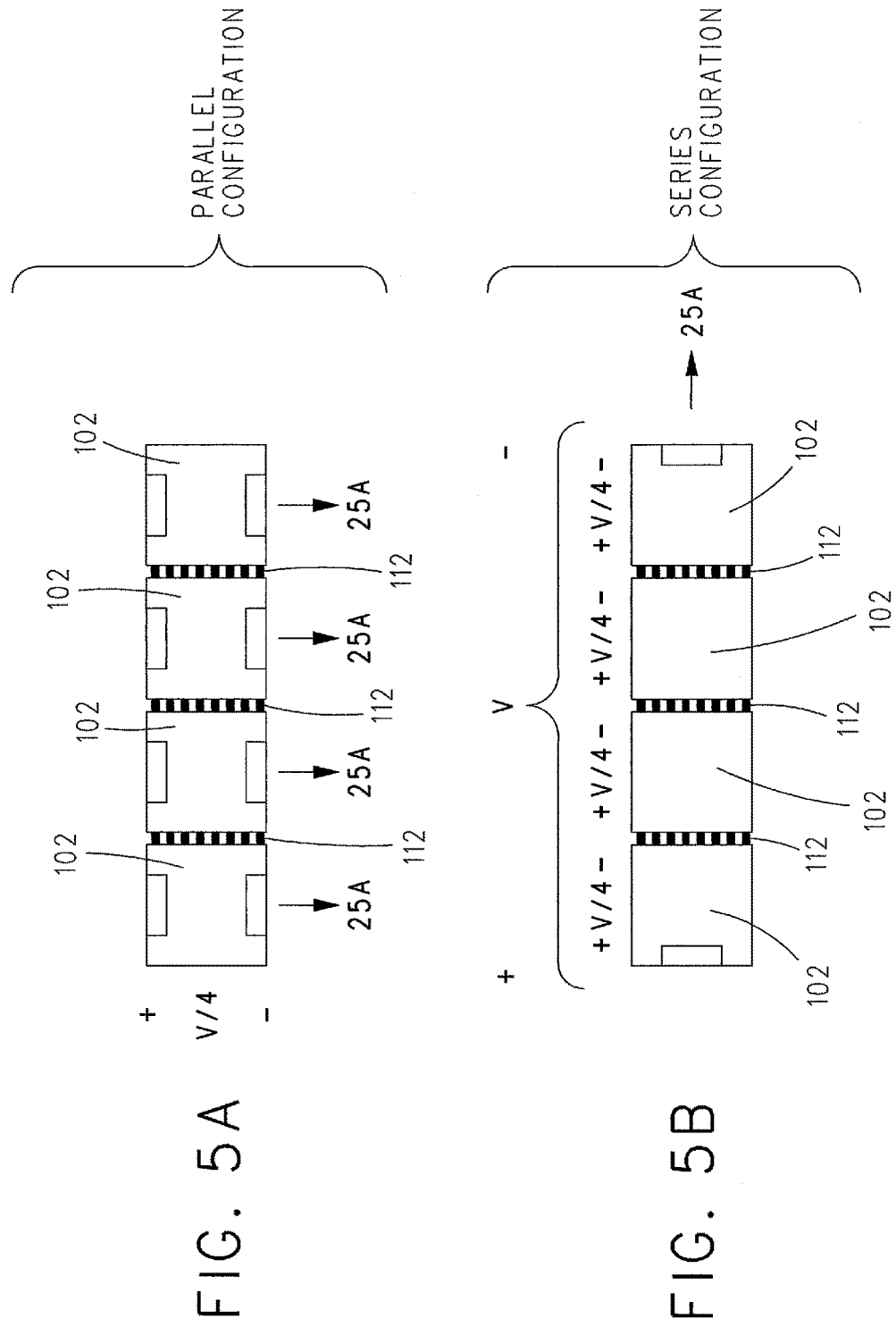

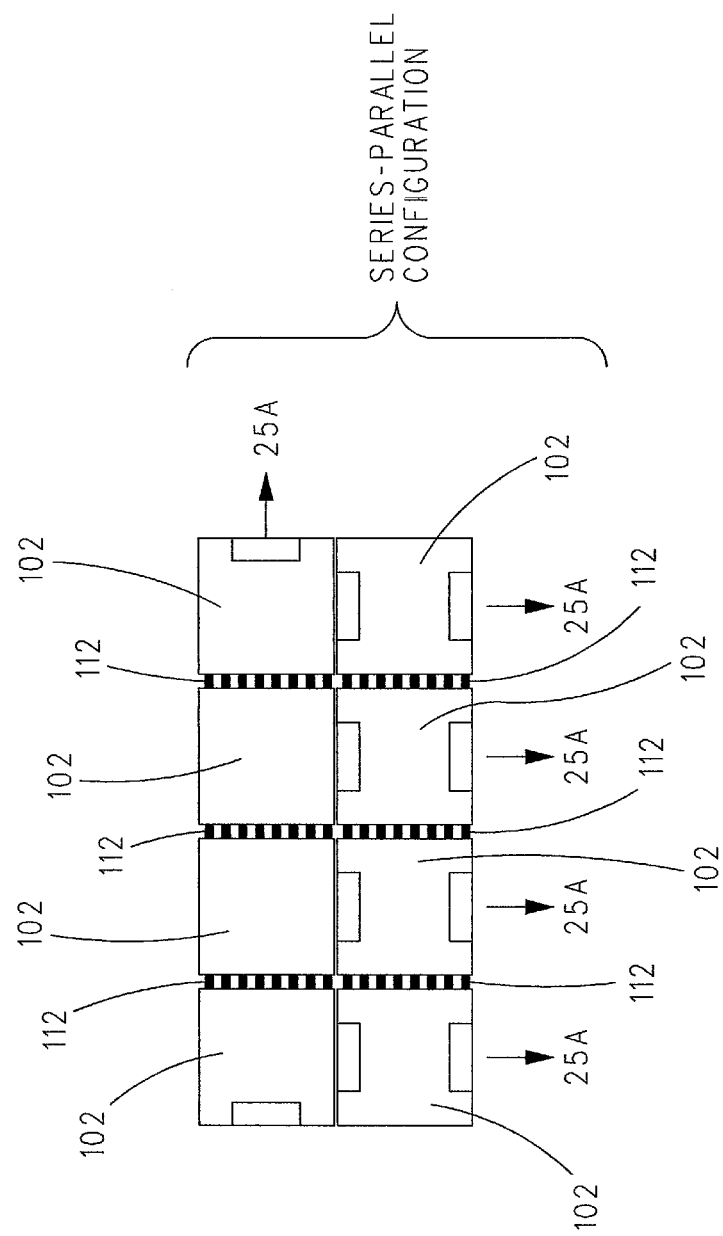

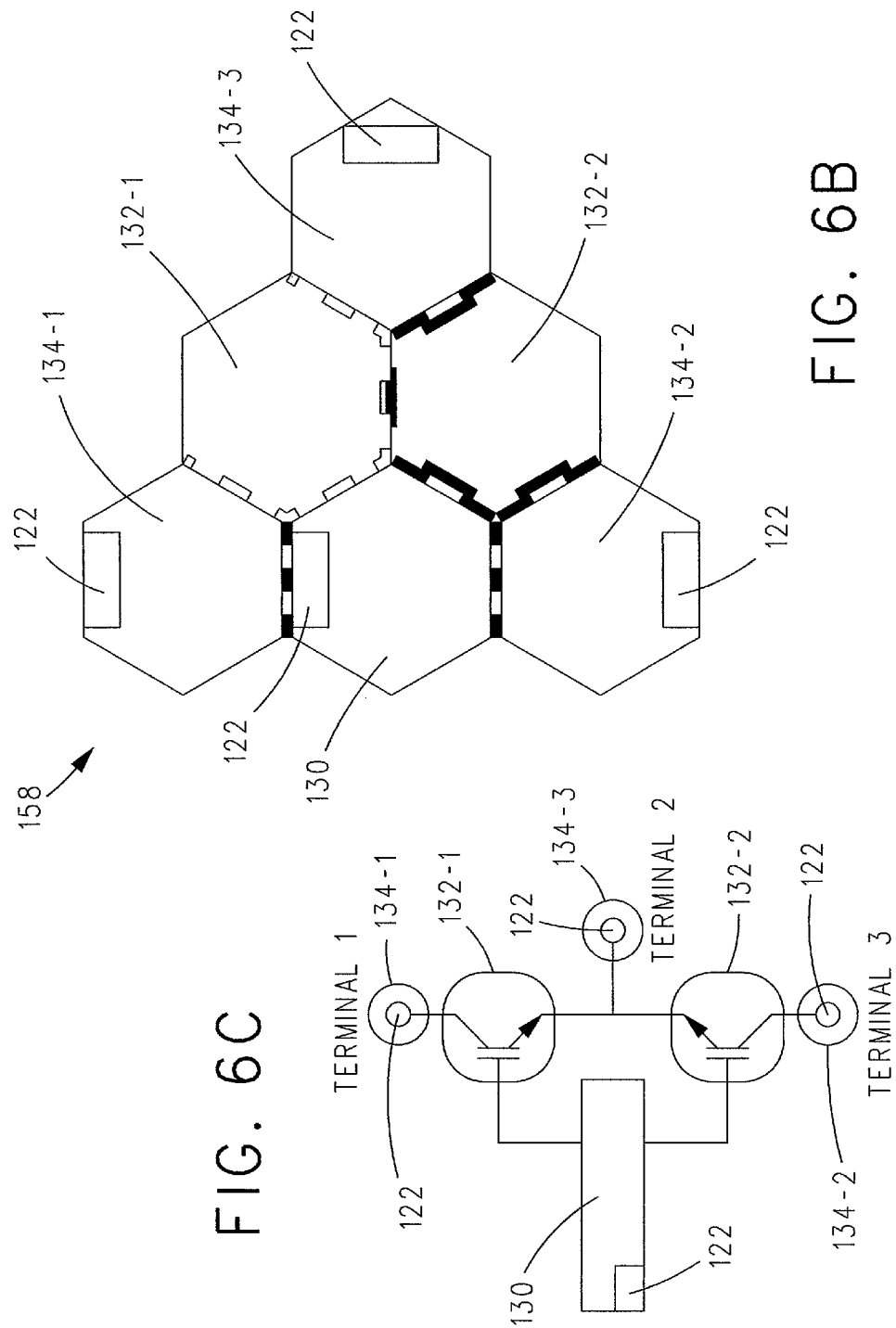

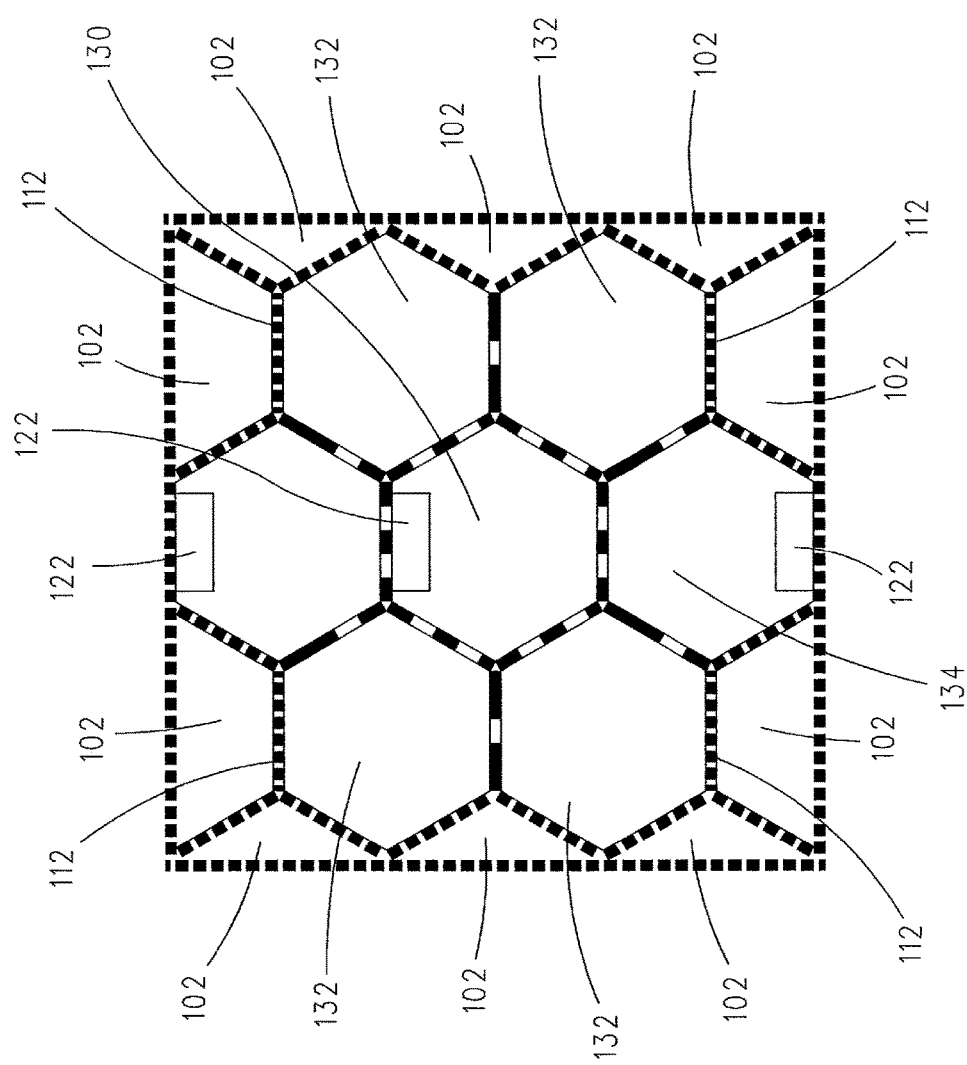

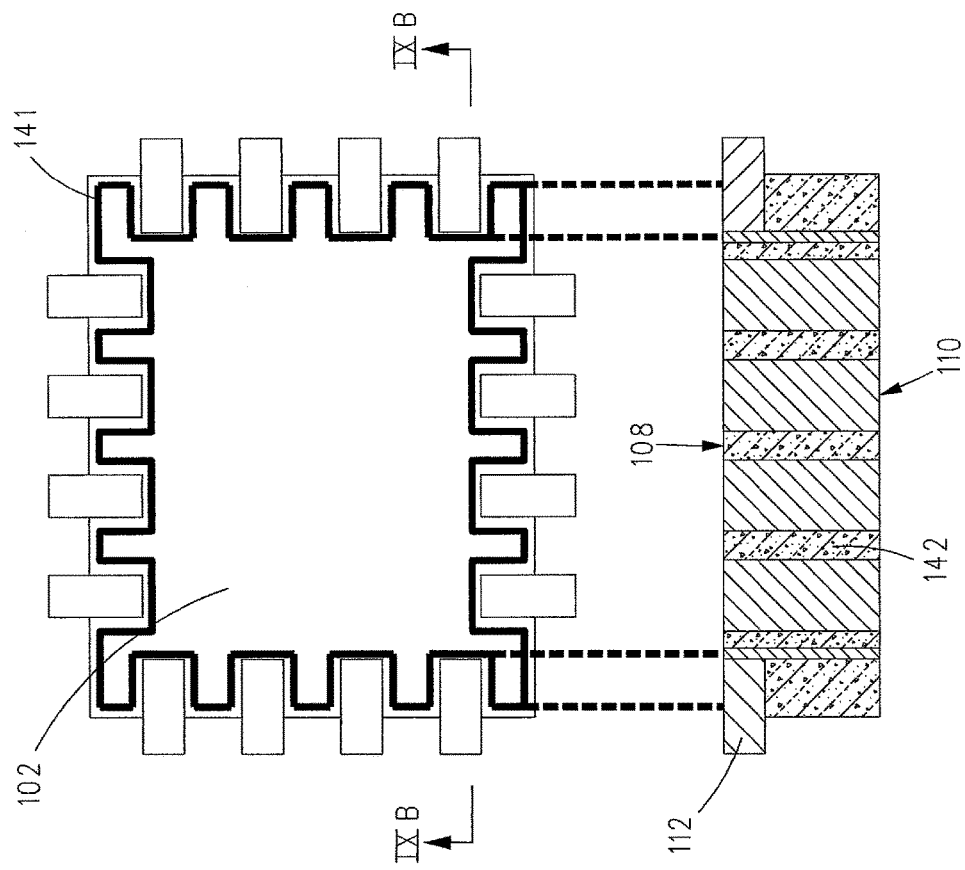

EDGE INTERCONNECT PACKAGING OF INTEGRATED CIRCUITS FOR POWER SYSTEMS

CROSS-REFERENCE TO RELATED APPLICATIONS

This application is the United States national phase of international Application No. PCT/US2015/040862 filed Jul. 17, 2015, and claims priority to U.S. Patent Application No. 62/026,260 filed Jul. 18, 2014, the disclosures of which are hereby incorporated in their entirety by reference.

BACKGROUND OF THE INVENTION

Field of the Invention

The present invention relates generally to microchips, microchip packaging, and the interconnection of microchips.

Description of Related Art

Affordable electronic systems having increased functionality and smaller packaging have been in demand for many years. Significant advances in microchip packaging and system design, including Quilt Packaging of microchips, have resulted from such demand. The process of forming interconnect nodules on the surface, or protruding laterally from the surface, of microchips is known generally in the art. One example of such technology is illustrated by U.S. Pat. No. 7,612,443, which is incorporated herein by reference.

As microchips are being formed, etching, metal plating, photolithography and other processes allow for the formation of solid metal contacts (nodules) along the vertical edges of microchips. In an example of forming microchips that include interconnect nodules, also called Quilt Package or QP nodules herein, semiconductor wafers contain multiple microchips with each microchip separated from its neighboring microchips on the wafer by "streets." Trenches are etched in the street regions and are passivated by forming one or more layers on the exposed surfaces of the trenches using techniques known in the art. Passivation techniques can include PECVD nitride, PECVD oxide, sputtered oxide, and low-k dielectrics or other dielectric materials. A resist coating is then applied to the wafer and subsequently removed from the trenches to form openings in the resist coating over the trenches. Metal is deposited into trenches through the openings in the resist. After the resist is removed, a plating process then is applied to the metal to form metal interconnect or QP nodules. The interconnect or QP nodules are further processed, including a chemical-mechanical polishing step, the addition of dielectric material, and the formation of on-chip electrical connections. Interconnect or QP nodules can also be formed to protrude over the edge of the microchip by performing an anisotropic etch followed by an isotropic etch causing vertical surfaces of the wafer to recede, allowing the interconnect or QP nodules to protrude beyond the edges of the microchip. For additional details regarding forming interconnect or QP nodules, see U.S. Pat. No. 7,612,443.

Wafer processing using these known techniques allows microchips to be manufactured and placed side by side with electrical interconnection directly through the interconnect or QP nodules without having to go through first level packaging to printed circuit boards or multi-chip modules. This process of directly connecting chips to form a quilt-like pattern is known in the art as Quilt Packaging. Nodules that protrude over the edge of the microchip (also known as edge interconnection nodules or Quilt Package (QP) nodules) further allow for increased integration of system components without sacrificing performance or increasing cost. It is desirable to use Quilt Packaging in ways not disclosed in the prior art to further increase these benefits.

SUMMARY OF THE INVENTION

Various preferred and non-limiting examples of the present invention will now be described as set forth in the following numbered clauses:

Clause 1: In an example, an integrated circuit packaging system is disclosed comprising first and second microchips, each microchip comprising a top surface, a bottom surface, one or more quilt package nodules fabricated on said top surface, and one or more bottom surface connectors; and a substrate on which the first and second microchips are mounted, wherein the first and second microchips are connected via the quilt package nodules.

Clause 2: The system of clause 1, further comprising one or more wirebonds extending from the top surface of at least one of the microchips to the substrate.

Clause 3: The system of clauses for 2, further comprising at least one circuit element that extends from the top surface to at least one of the bottom surface connectors of the first microchip.

Clause 4: The system of any of clauses 1-3, further comprising at least one circuit element that extends from the top surface to at least one of the bottom surface connectors of the second microchip.

Clause 5: The system of any of clauses 1-4, further comprising a third microchip connected via quilt package nodules to at least one of the first and second microchips, the third microchip having at least one circuit element that extends from a top surface to at least one bottom surface connector of the third microchip.

Clause 6: The system of any of clauses 1-5, further comprising the second microchip comprising at least one planar circuit element.

Clause 7: The system of any of clauses 1-6, further comprising a third microchip connected via quilt package nodules to at least one of the first and second microchips, the third microchip comprising a planar circuit element, or a circuit element that extends from a top surface to at least one bottom surface connector of the third microchip, or both a planar circuit element and a circuit element that extends from the top surface to at least one bottom surface connector of the third microchip.

Clause 8: The system of any of clauses 1-7, where the substrate comprises an integrated circuit package.

Clause 9: The system of any of clauses 1-8, further comprising an input-output terminal to which the first microchip is connected via a quilt package nodule of the first microchip to a surface of the input-output terminal.

Clause 10: The system of any of clauses 1-9, further comprising an input-output terminal to which the first microchip is connected via a quilt package nodule of the first microchip inserted into a socket of the input-output terminal.

Clause 11: In another example, an integrated circuit packaging system is disclosed comprising a microchip comprising a top surface, a bottom surface, one or more quilt package nodules fabricated on said top surface, and one or more bottom surface connectors; a substrate on which the microchip is mounted; and an input-output terminal to which the microchip is connected via a quilt package nodule of the microchip to the surface of the input-output terminal.

Clause 12: The system of clause 11, further comprising one or more wirebonds extending from the top surface of the microchip to the substrate.

Clause 13: The system of clause 11 or 12, further comprising at least one circuit element that extends from the top surface to the bottom surface of the microchip.

Clause 14: The system of any of clauses 11-13, further comprising at least one planar circuit element that extends along the top surface of the microchip.

Clause 15: The system of any of clauses 11-14, further comprising a second microchip connected via quilt package nodules to the microchip, the second microchip comprising a planar circuit element, or a circuit element that extends from a top surface to at least one bottom surface connector of the second microchip, or both a planar circuit element and a circuit element that extends from the top surface to at least one bottom surface connector of the second microchip.

Clause 16: In another example, an integrated circuit packaging system is disclosed comprising a microchip comprising a top surface, a bottom surface, one or more quilt package nodules fabricated on said top surface, and one or more bottom surface connectors; a substrate on which the microchip is mounted; and an input-output terminal to which the first microchip is connected via a quilt package nodule of the first microchip inserted into a notch or socket of the input-output terminal.

Clause 17: The system of clause 16, further comprising one or more wirebonds extending from the top surface of the microchip to the substrate.

Clause 18: The system of clauses 16 or 17, further comprising at least one circuit element that extends from the top surface to the bottom surface of the microchip.

Clause 19: The system of any of clauses 16-18, further comprising at least one planar circuit element that extends along the top surface of the microchip.

Clause 20: The system of any of clauses 16-19, further comprising a second microchip connected via quilt package nodules to the first microchip, the second microchip comprising a planar circuit element, or a circuit element that extends from a top surface to at least one bottom surface connector of the second microchip, or both a planar circuit element and a circuit element that extends from the top surface to at least one bottom surface connector of the second microchip.

BRIEF DESCRIPTION OF THE DRAWINGS

FIG. 3B is a view taken along lines IIIB-IIIB in FIG. 3A.

FIG. 4B is a view taken along lines IVB-IVB in FIG. 4A.

FIG. 4D is a view taken along lines IVD-IVD in FIG. 4C.

FIG. 4F is a view taken along lines IVF-IVF in FIG. 4E.

FIGS. 5A and 5B are plan views of a number of microchips connected with QP nodules in parallel and in series connection, respectively.

FIG. 5C is a plan view of a number of microchips connected with QP nodules in series-parallel connection.

FIG. 6B is a plan view of a number of hexagon-shaped microchips interconnected with QP nodules to form all or part of a functioning electrical circuit.

FIG. 6C is a schematic drawing of an example electrical circuit that can be formed by the QP nodule connected microchips in FIG. 6B.

FIG. 6D is a plan view of a number of differently shaped microchips interconnected with QP nodules to form a square or rectangular electrical circuit.

FIG. 9A is a plan view of a microchip with QP nodules including a castellated guard ring.

FIG. 9B is a section taken along lines IXB-IXB in FIG. 9A.

DETAILED DESCRIPTION OF THE INVENTION

Examples will now be described with reference to the accompanying figures where like reference numbers correspond to like or functionally equivalent elements.

Figure 1A:
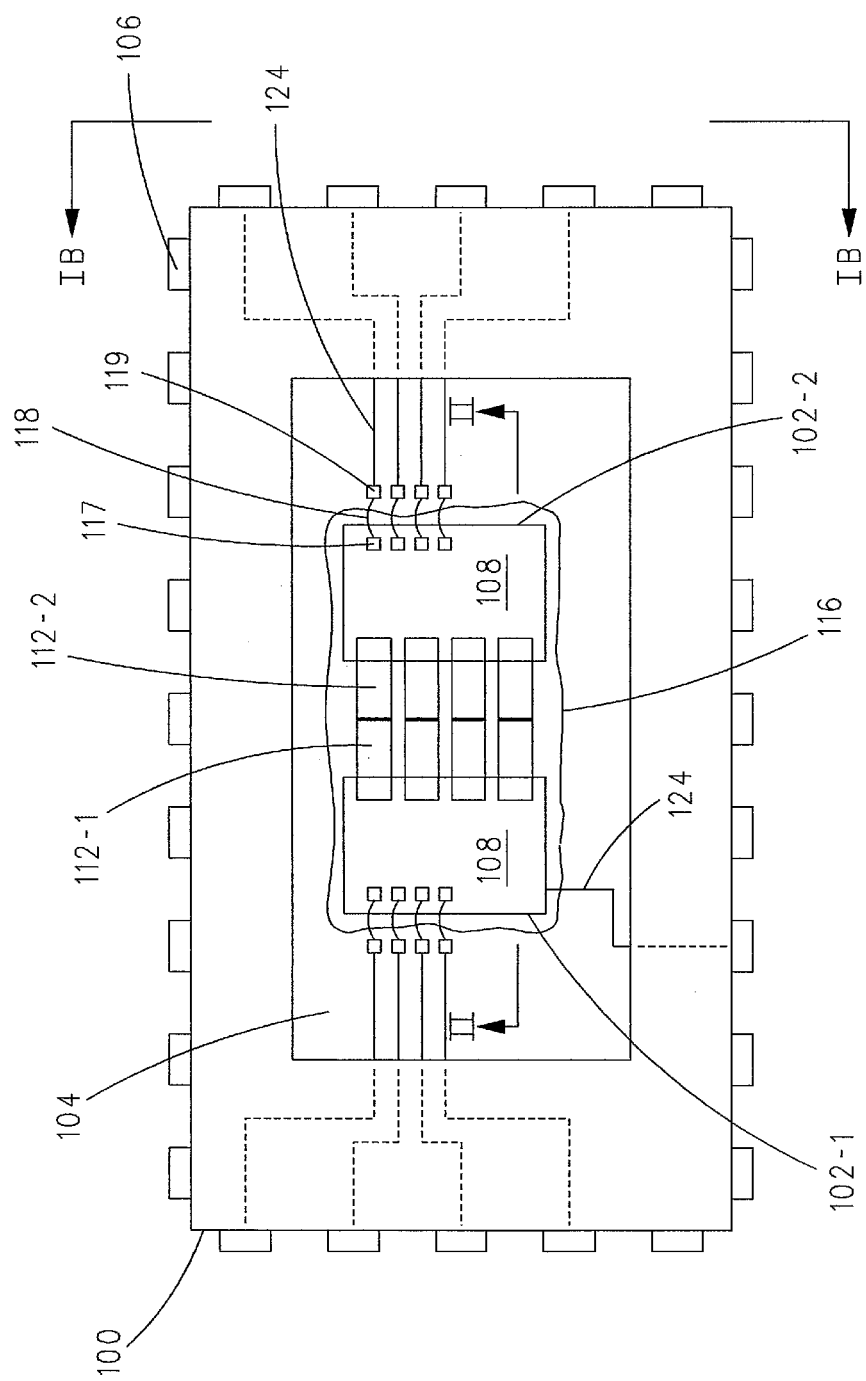
FIG. 1A is a plan view of a microchip package with the top removed showing a pair of microchips received on or mounted on a package substrate and connected via QP nodules (also known as quilt package nodules or edge interconnect nodules or simply interconnect nodules), wirebonds connected between conductive bonding pads on top surfaces of the microchips and conductive bonding pads on the surface of the substrate, package-level I/O terminals that can be connected to the conductive bonding pads on the substrate surface via conductors of the package, and underfill.
Figure 1B:
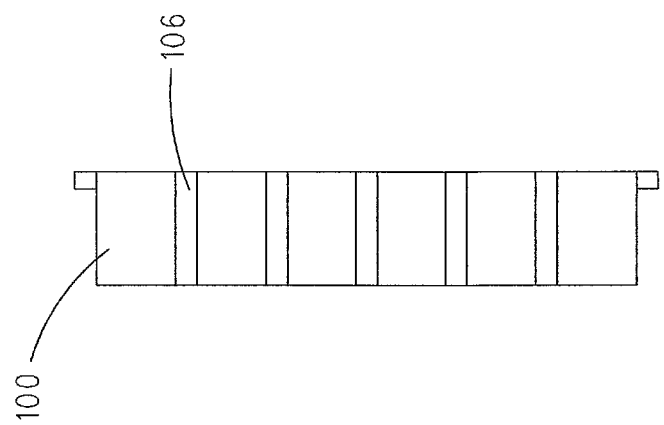
FIG. 1B is a view taken along lines IB-IB in FIG. 1A.

With reference to FIGS. 1A and 1B, an example microchip package 100 with the top removed includes two microchips 102-1 and 102-2 mounted on the package substrate 104. Although shown in a typical, rectangular package design, example package 100 can be of any size, shape or design. Each microchip 102-1 and 102-2 includes one or more quilt package (QP) nodules 112 to provide electrical connection between microchips 102 and/or mechanical stability. QP nodules 112 and the method of making QP nodules is known in the art and will not be further described herein for simplicity (see e.g., U.S. Pat. No. 7,612,443, where the QP nodules described herein are referred to as "interconnect nodules." Optional wirebonds 118 are shown which can be connected between conductive bonding pads 117 on a top surface 108 of one or both microchips 102 and conductive bonding pads 119 on package substrate 104, for further connection to package-level I/O terminals 106 via conductors 124 of package 100. Package-level I/O terminals 106 provide further connection of package 100 to a printed circuit board or other system-level packaging (not shown). Package-level I/O terminals 106 can be copper, other conductive material, or a flexible ribbon or stranded assembly, all of which are known in the art.

Figure 2:
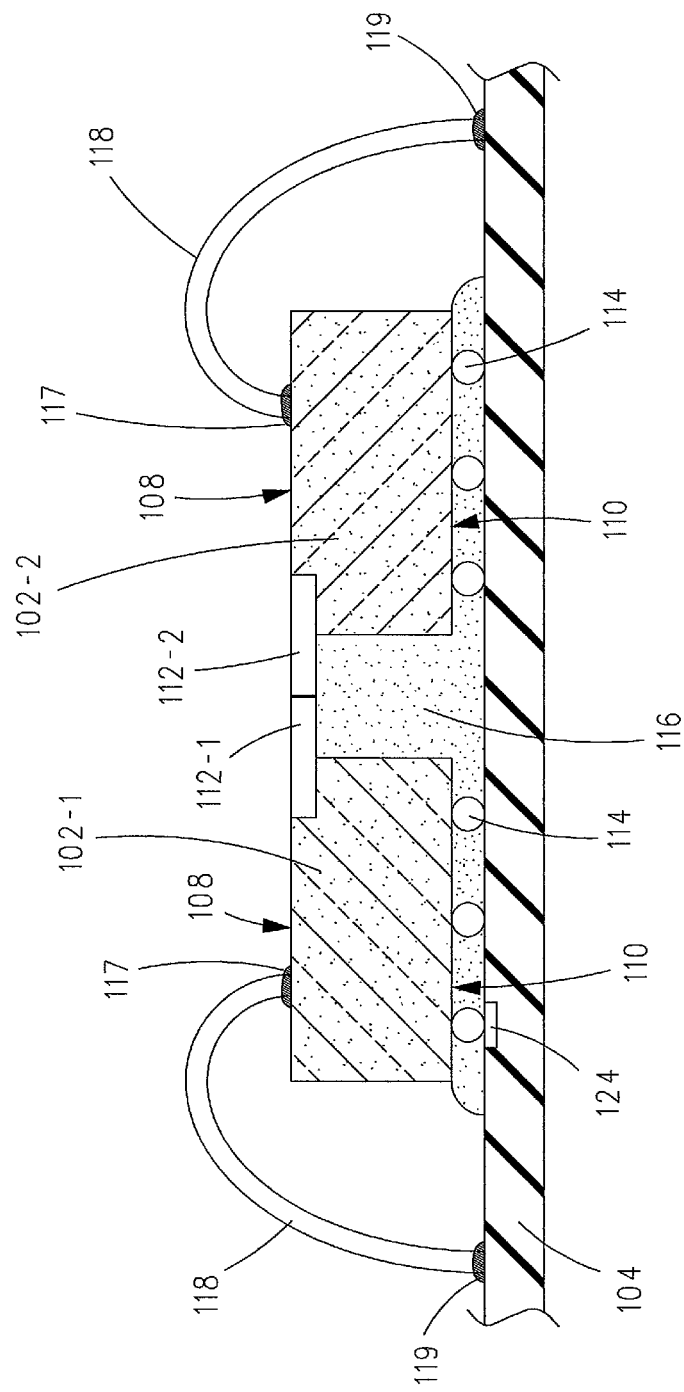
FIG. 2 is an isolated cross-section taken along lines II-II in FIG. 1A.

With reference to FIG. 2 and with continuing reference to FIGS. 1A and 1B, microchips 102-1 and 102-2 each have a top surface 108 and a bottom surface 110. Each microchip 102 has formed on its top surface 108 (in a manner known in the art) one or more QP nodules 112 to provide electrical connection between microchips 102 and/or mechanical stability. In an example, microchips 102-1 and 102-2 include QP nodules 112-1 and 112-2, respectively, connected at their distal ends. Herein, unless otherwise described, it is to be understood that QP nodules, e.g., 112-1 and 112-1, are connected via their distal ends in a manner known in the art, e.g., soldering or conductive adhesive.

Each QP nodule 112 can be fabricated directly on the surface of the corresponding microchip 102 with various processes known in the art, such as shown in U.S. Pat. No. 7,612,443. Further, each QP nodule 112 can be formed to protrude beyond the edge of microchip 102. Each microchip 102 can contain circuitry (not specifically shown) which performs different functions, including, but not limited to, interconnection functions, or the functions of a power system.

Also shown is package substrate 104. In an example, one or both microchips 102 can have one or more optional bottom surface connectors 114 which can be used to connect circuitry of microchips 102 to package substrate 104 via optional I/O contact pads (not shown) on the bottom of microchips 102 and package substrate 104 in a manner known in the art. The bottom surface connectors 114 can be in the form of one or more conductive pads, solder balls, bump bonds or other interconnection technology. Further, bottom surface connectors 114 can provide electrical input and output connection, mechanical stability and other functionality. In an example, a bottom surface connector 114 can be utilized to connect a contact pad on the bottom surface 110 of a microchip 102 to a package level I/O terminal 106 via a contact pad on the surface of package substrate 104 via an I/O conductor 124 of package 100 in a manner know in the art. The illustration and discussion of optional bottom surface connectors 114 is not to be construed as limiting since it is envisioned that any suitable and/or desirable interconnect technology now known or hereafter developed that facilitates input/output connections between the bottom surface of one or both microchips 102 and package substrate 104 can be used. Also or alternatively, it is envisioned that the bottom surface of one or both microchips 102 can be directly coupled to package substrate 104 in a manner known in the art when bottom surface connectors 114 are not required for bottom surface 110 connection to circuitry of a microchip 102.

Between adjacent microchips 102 and package substrate 104 is shown an optional underfill material 116. Underfill material 116 can be an adhesive material for attaching microchips 102-1 and 102-2 to substrate 104, or an insulating material, or possess thermal conductivity properties to be used as a heatsink, or some combination thereof, or possess other functional properties.

Figure 3A:
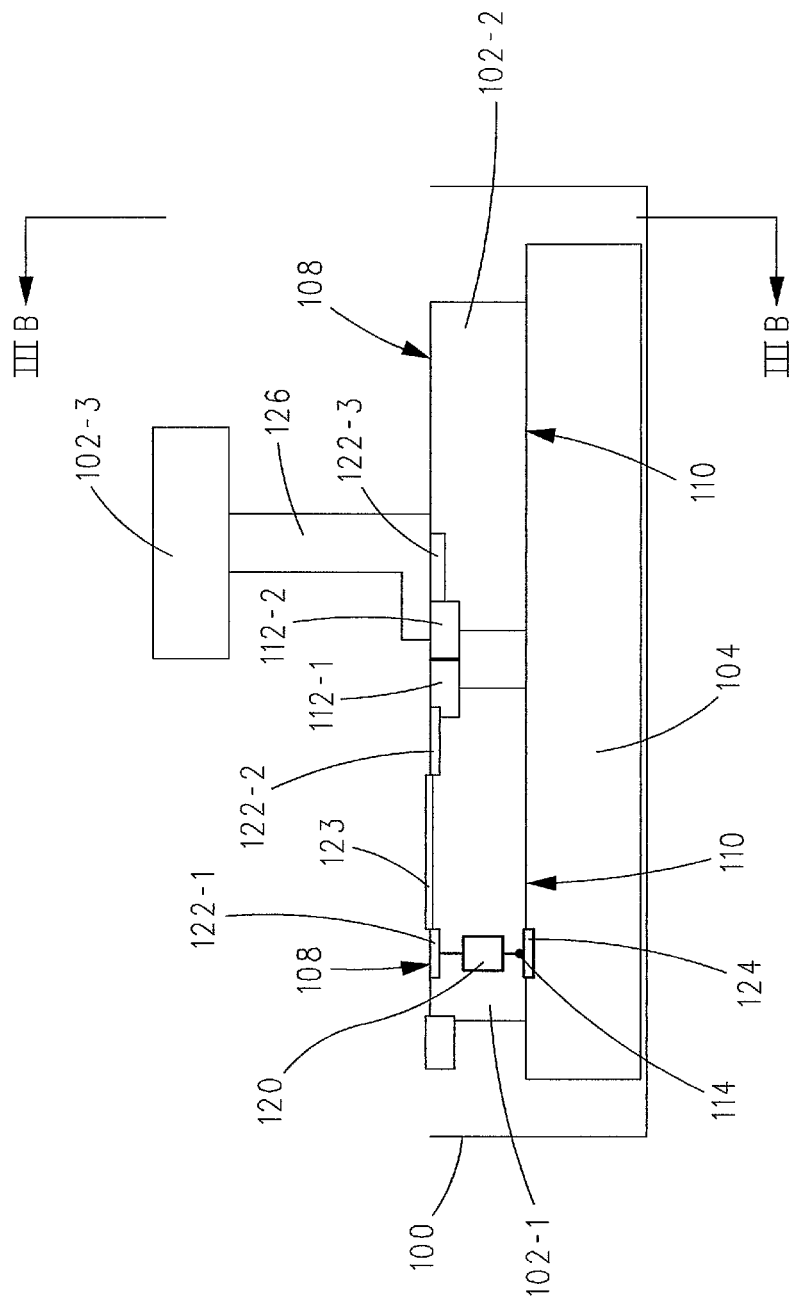
FIG. 3A is a section of an isolated portion of a microchip package showing a side view of two substrate mounted microchips and one vertically mounted microchip connected with QP nodules and including a schematic representation of a vertical circuit element in one microchip.

With reference to FIGS. 3A-3B, in another example microchips 102-1 and 102-2 are connected via the distal ends of QP nodules 112-1 and 112-2. Microchip 102-1, which can be a power integrated circuit (for example), is shown as having a vertical circuit element 120 extending from top surface 108 to bottom surface 110. Microchip 102-2 can be another power integrated circuit, an active or passive semiconductor, or circuit, or other type of circuit element. Each vertical circuit element 120 can be fabricated by any process known in the art, such as described in "Improvement of a Vertical Thin Film Transistor Based on Low-Temperature Polycrystalline Silicon Technology by Introduction of an Oxide Barrier between Drain and Source Layers," by P. Zhang, et. al., Departement Microelectronique et Microcapteurs, IETR, UMR CNRS 6164, Universite de Rennes 1, Campus Beaulieu, 35042 Rennes Cedex, France.

Electrical signals from microchip 102-1 can be routed or coupled to or between one or more I/O pads 122-1 and 122-3 on the top surface 108 of microchip 102-1 through a surface conductor 123 to QP nodule 112-1 for further routing or coupling to QP nodule 112-2 and/or I/O pads 122-3 of microchip 102-2, and/or to a microchip 102-3 (which can be another power integrated circuit, an active or passive semiconductor, or circuit, or other type of circuit element) through one or more L-shaped conductive I/O terminals 126, which can be used to provide power, ground, signals and/or other functional connections. Electrical signals from microchip 102-1 can also or alternatively be routed via one or more bottom surface connectors 114 to an I/O terminal 126 (shown best in FIG. 1A) of package 100 via one or more I/O conductors 124 of package 100. It is envisioned that multiple I/O terminals 126 (shown for example in FIG. 3B) can be used to route or couple signals between microchip 102-2 and one or more QP nodules 112, one or more I/O pads 122, and/or one or more conductors 123.

Figure 4A:
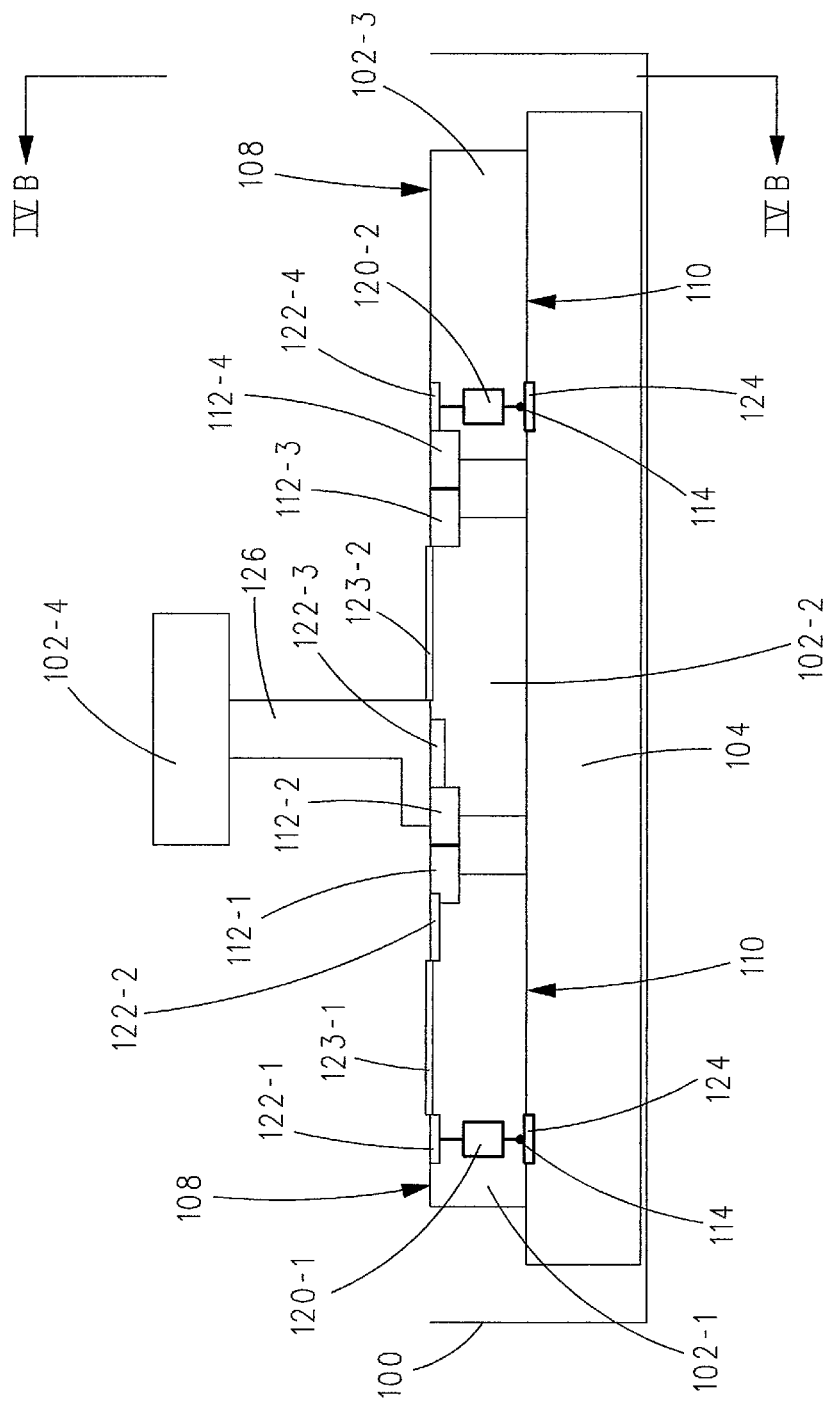
FIG. 4A is a section of an isolated portion of a microchip package showing a side view of three substrate mounted microchips and one vertical mounted microchip connected with QP nodules and including schematic representations of vertical circuit elements in two of the microchips.

With reference to FIGS. 4A-4B, in another example microchips 102-1, 102-2, and 102-3 are connected via distal ends of QP nodules 112. In this example, microchips 102-1 and 102-3 have vertical circuit elements 120-1 and 120-2 extending from their top surfaces 108 to their bottom surfaces 110. Microchip 102-2 can be another power integrated circuit, an active or passive semiconductor, or circuit, or other type of circuit element. One or more I/O pads 122-1, 122-2 and 122-3 and conductors 123-1 and 123-2 on top surfaces 108 of microchips 102-1 and 102-2, and one or more QP nodules e.g., 112-1, 112-2, 112-3, and 112-4 can be used to route or couple electrical signals between microchips 102-1 and 102-2 and microchips 102-2 and 102-3. Also or alternatively, L-shaped conductive I/O terminal 126 can be used to route or couple one or more electrical signals to and/or from microchip 102-4 from and/or to, for example, I/O pad 122-3, QP nodule 112-2, and/or surface conductor 123-2. It is envisioned that multiple I/O terminals 126 (shown for example in FIG. 4B) can be used to route or couple signals between microchip 102-4 and one or more QP nodules 112, one or more I/O pads 122, and/or one or more conductors 123.

Microchip 102-4 can be another power integrated circuit, an active or passive semiconductor, or other type of circuit element. Electrical signals from microchips 102-1 and 102-3 can optionally be routed or coupled via one or more bottom surface connectors 114 to one or more I/O conductors 124 of package 100 in the manner described above.

Figure 4C:
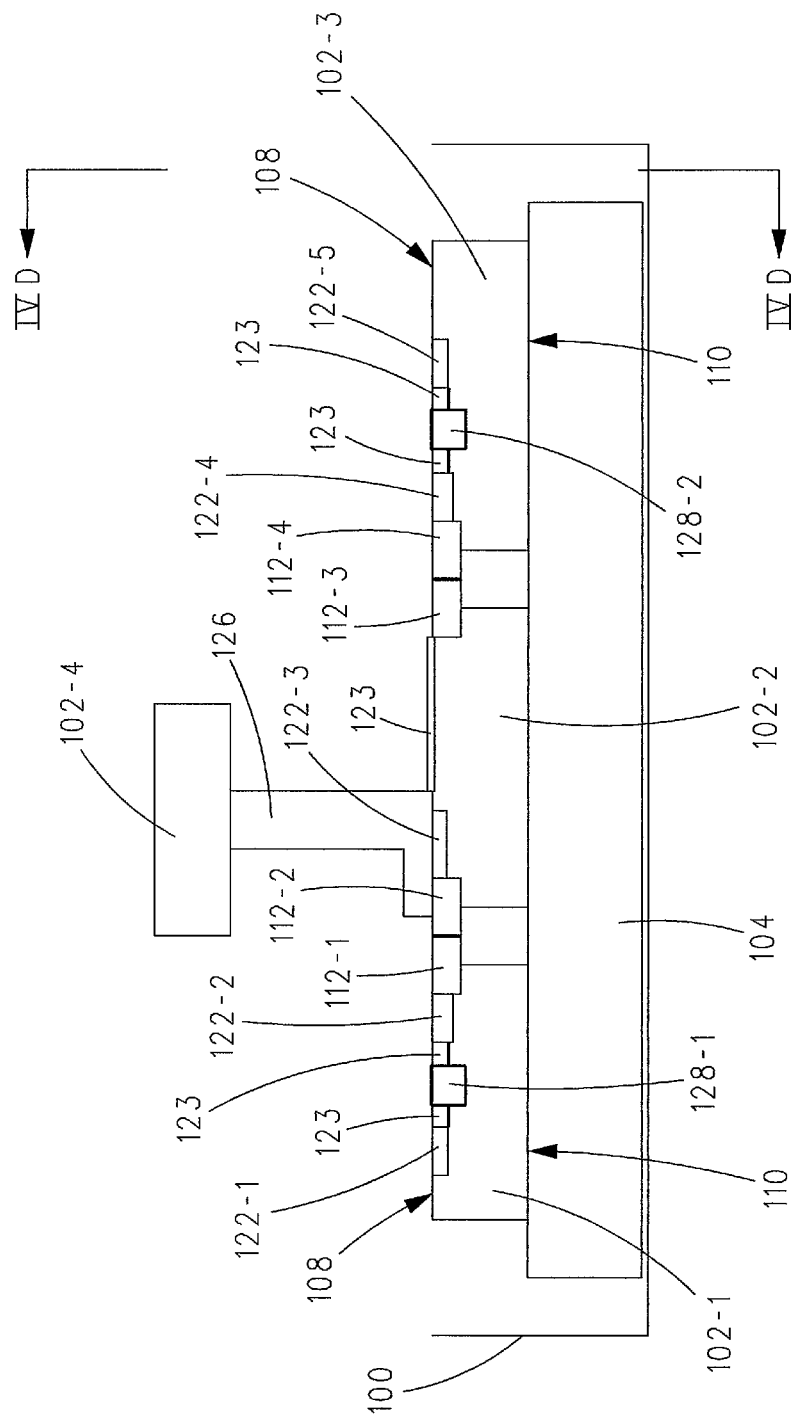
FIG. 4C is a section of an isolated portion of a microchip package showing a side view of three substrate mounted microchips and one vertical mounted microchip connected with QP nodules and including schematic representations of planar circuit elements in two of the microchips.

With reference to FIGS. 4C-4D, in another example microchips 102-1, 102-2, and 102-3 are connected via distal ends of QP nodules 112. In this example, microchips 102-1 and 102-3 have planar circuit elements 128-1 and 128-3. Microchip 102-2 can be another power integrated circuit, an active or passive semiconductor, or circuit, or other type of circuit element. Electrical signals from each microchip 102-1, 102-2 and/or 102-3 can be routed or coupled to adjacent microchip(s) 102 via one or more I/O pads 122-1-122-5 on top surface(s) 108, QP nodules 112-1-112-4, and/or one or more surface conductors 123. Microchip 102-4, which can be another power integrated circuit, an active or passive semiconductor, or other type of circuit element, can be coupled via a conductive I/O terminal 126 to QP nodule 112-2, I/O pad 122-3, and/or surface conductor 123, which can be used to provide power, ground, signals and/or other functional connections. It is envisioned that multiple I/O terminals 126 can be used to route or couple power, ground, signals and/or other functional connections between microchips 102-4 and one or more QP nodules 112, one or more I/O pads 122, and/or one or more conductors 123.

Figure 4E:
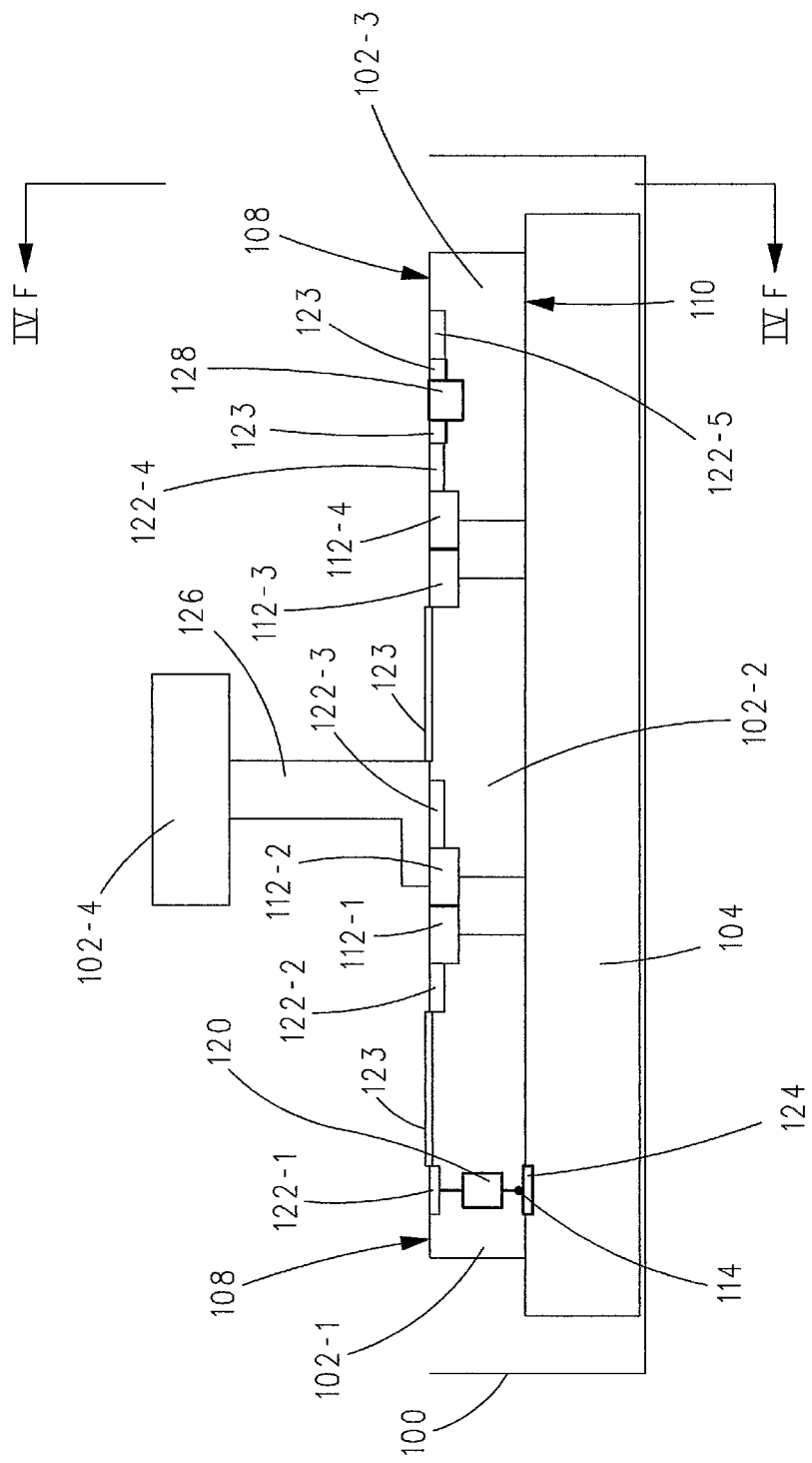
FIG. 4E is a section of an isolated portion of a microchip package showing a side view of three substrate mounted microchips and one vertical mounted microchip connected with QP nodules and including a schematic representation of a vertical circuit element in one of the microchips and a schematic representation of a planar circuit element in another microchip.

With reference to FIGS. 4E-4F, in another example microchips 102-1, 102-2, and 102-3 are connected via QP nodules 112. For example, the distal ends of QP nodules 112-1 and 112-2 are connected and the distal ends of QP nodules 112-3 and 112-4 are connected. In this example, microchip 102-3 has a planar circuit element 128 and microchip 102-1 has a vertical circuit element 120 extending between its top surface 108 and its bottom surface 110. Microchip 102-2 can be another power integrated circuit, an active or passive semiconductor, or circuit, or other type of circuit element. Electrical signals from each microchip 102-1, 102-2 and/or 102-3 can be routed or coupled to adjacent microchip(s) 102 via one or more I/O pads 122-1-122-5 on top surface(s) 108, QP nodules 112-1-112-4, and/or surface conductor 123. Microchip 102-4, which can be another power integrated circuit, an active or passive semiconductor, or other type of circuit element, can be coupled via a conductive I/O terminal 126 to QP nodule 112-2, I/O pad 122-3, and/or surface conductor 123, which can be used to provide power, ground, signals and/or other functional connections. It is envisioned that multiple I/O terminals 126 (shown for example in FIG. 4F) can be used to route or couple power, ground and/or signals between microchip 102-4 and one or more QP nodules 112, one or more I/O pads 122, and/or one or more conductors 123.

Electrical signals from microchip 102-1 can also or alternatively be routed or coupled through one or more bottom surface connectors 114 to one or more I/O terminals 126 (shown best in FIG. 1A) of package 100 via one or more I/O conductors 124 of package 100.

The examples described with respect to FIGS. 4A-4F, are not meant to be construed as limiting the possible number of combinations and arrangements of microchips 102. Multiple instances of microchips 102, connected via QP nodules 112, containing combinations of planar circuit elements 128 and vertical circuit elements 120 and routing or coupling of electrical signals are envisioned.

With reference to FIGS. 5A-5C, in another example QP nodules 112 can be utilized to form parallel, series, or series-parallel connections of microchips 102. Connecting microchips in this manner can achieve circuits with higher voltage and/or current ratings than individual microchips. Microchips 102 connected by QP nodules 112 can be configured in parallel or series as shown in FIGS. 5A and 5B, respectively, or in series-parallel combination as shown in FIG. 5C.

Figure 6A:
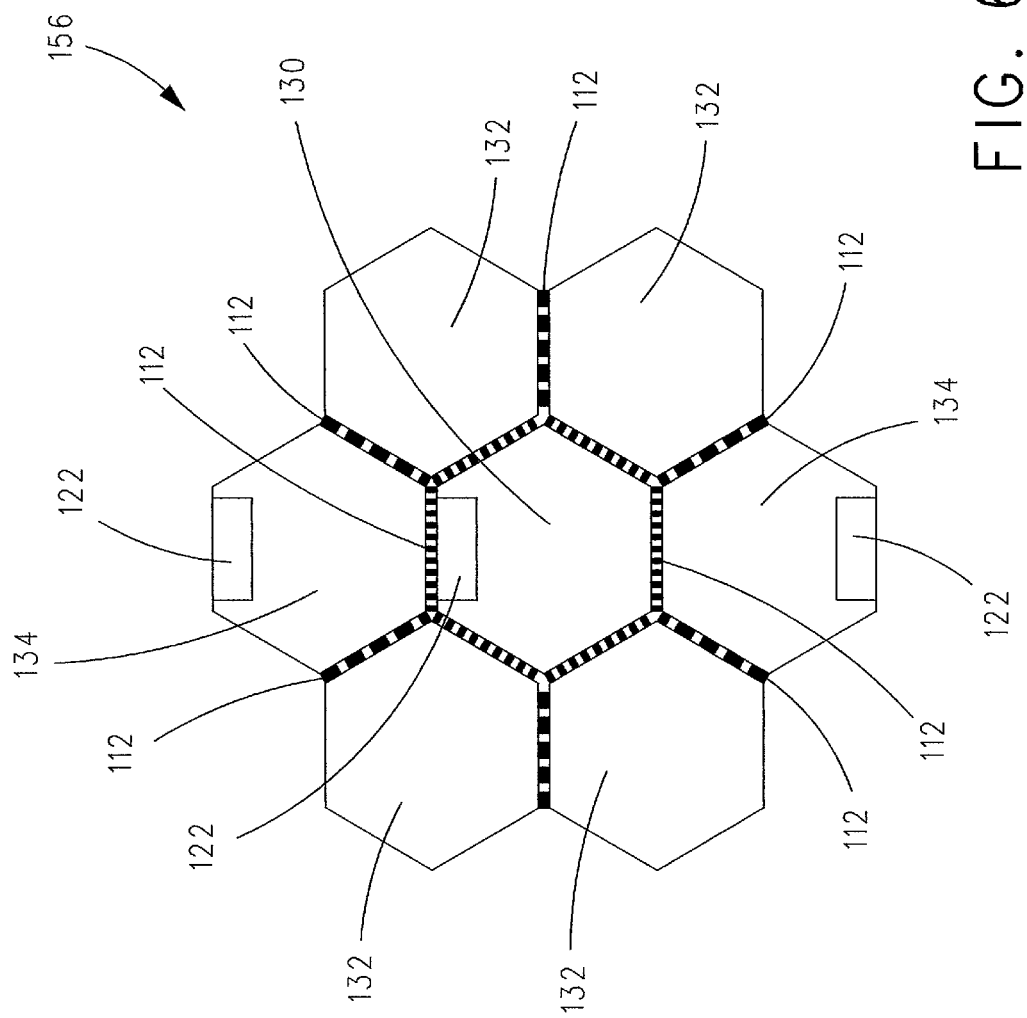
FIG. 6A is a plan view of a number of hexagon-shaped microchips interconnected with QP nodules.

With reference to FIG. 6A, in another example QP nodules 112 can be utilized to couple non-rectangular or non-square microchips, e.g., hexagonal-shaped microchips, to form any suitable and/or desirable shape 156. In this example, a hexagonal-shaped control microchip 130 is surrounded by and connected via QP nodules 112 to hexagonal-shaped power microchips 132 and other hexagonal-shaped microchips 134 which, in this example, include I/O pads 122. Microchips 134 can, in an example, include conductors (like surface conductor 123 above, not shown in FIG. 6A) that route or couple power, ground, and/or signals to or from I/O pads 122 from or to external resources. To this end, microchips 134 can function as power, ground and signal interfaces between microchips 130 and/or 132 and external resources, such as, for example, a power supply, a reference ground, a signal source, or another device or microchip configured to supply or receive power, ground or a signal to or from shape 156. In this example, microchips 134 operate in the nature of I/O and/or signal distribution microchips. Also or alternatively, microchips 134 can be other power integrated circuits, active or passive semiconductors, or circuits, or other types of circuit elements. I/O pads 122 are shown on semiconductor substrates 134 and on control microchip 130 to illustrate possible connection points to other circuit elements or to packaging (not shown), but are not to be construed in a limiting sense.

With reference to FIG. 6B, in another example, hexagonal-shaped microchips are interconnected to form any suitable and/or desirable shape 158. In this example, hexagonal control IC 130 is surrounded on four sides by and are connected via QP nodules 112 to power IC chips 132-1 and 132-2 and microchips 134-1 and 134-2, for example I/O microchips with I/O pads 122. I/O microchip 134-3, including I/O pad 122, is connected to power IC chips 132-1 and 132-2 In this example, microchips 134-1, 134-2 and 134-3 are passive semiconductors that facilitate signal routing or distribution, e.g., in the manner of a printed circuit board. FIG. 6B is included to provide an example of a possible functional configuration of the microchips shown in FIG. 6B to form all or part of a functioning circuit. A schematic circuit diagram (FIG. 6C) is also shown with reference numbers corresponding to like elements in FIG. 6B. Numerous other circuit diagrams and configurations of microchips with QP nodules are possible. In the example shown in FIGS. 6A-6B, microchip 130 can be a signal source which provides one or more suitable signals to the base terminals of the transistors of microchips 132-1 and 132-2.

With reference to FIG. 6D, this figure shows another example of a potentially large number of possible combinations of microchip shapes, functions and configurations. In this example, the shape shown in FIG. 6A is combined with additional microchips 102 of one or more different shapes (for example, quadrilateral-shaped microchips and triangular-shaped microchips), all with QP nodules 112 to form, in this example, an overall square or rectangular shape of QP nodule connected microchips. Each additional microchip can be another power integrated circuit, an active or passive semiconductor, or circuit, or other type of circuit element, and each additional microchip can have the same or different function.

Figure 7A:
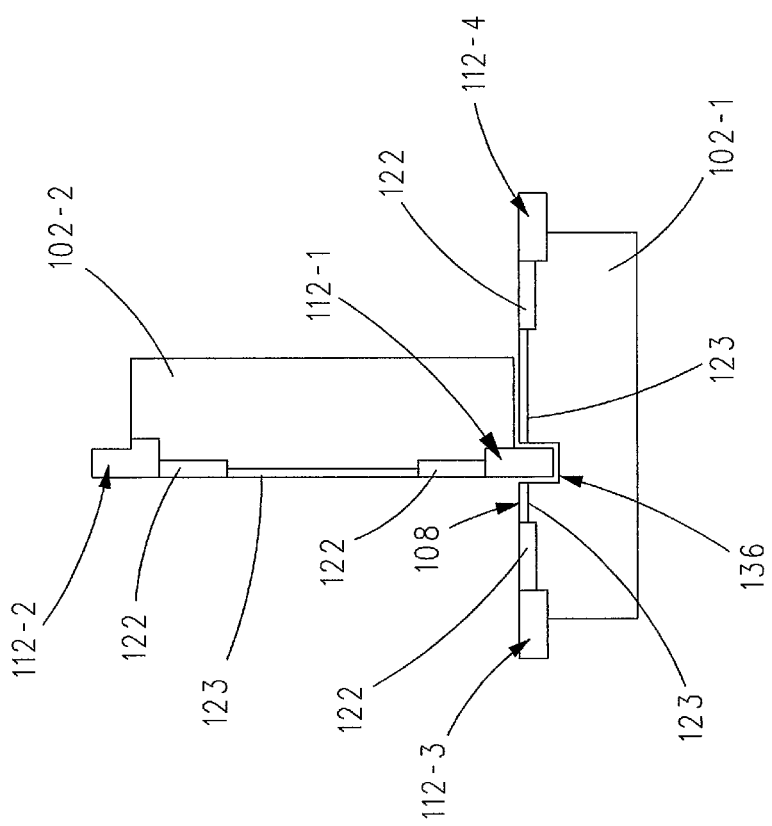
FIG. 7A is a side view of a vertical microchip connected to a horizontal microchip with a QP nodule and a conductive socket element, respectively.

With reference to FIG. 7A, in another example one or more conductive sockets 136 can be fabricated into the top surface 108 of horizontal microchip 102-1. Each conductive socket 136 can be fabricated by various means known in the art. Vertical microchip 102-2 can be connected to microchip 102-1 via the distal end of one or more QP nodules 112-1 of microchip 102-2 inserted into the one or more conductive sockets 136. Each QP nodule 112 of microchip 102-2 can be electrically connected to one or more I/O pads 122, one or more conductors 123, one or more other QP nodules 112, and/or other circuitry of microchip 102-2. Similarly, socket 136 can be electrically connected to one or more I/O pads 122, one or more conductors 123, one or more QP nodules 112-3-112-4, and/or other circuitry of microchip 102-1. QP nodule 112-1 inserted into socket 136 can create an electrical connection between electrical circuitry or connections of microchip 102-2 and microchip 102-1. Connecting microchips 102-1 and 102-2 in the manner shown in FIG. 7A can also or alternatively provide thermal conductivity for heat management, can be used to provide multiple functions, e.g., power, ground or signal paths, can include active or passive circuitry, or can simply be for providing mechanical strength to a system.

Figure 7B:
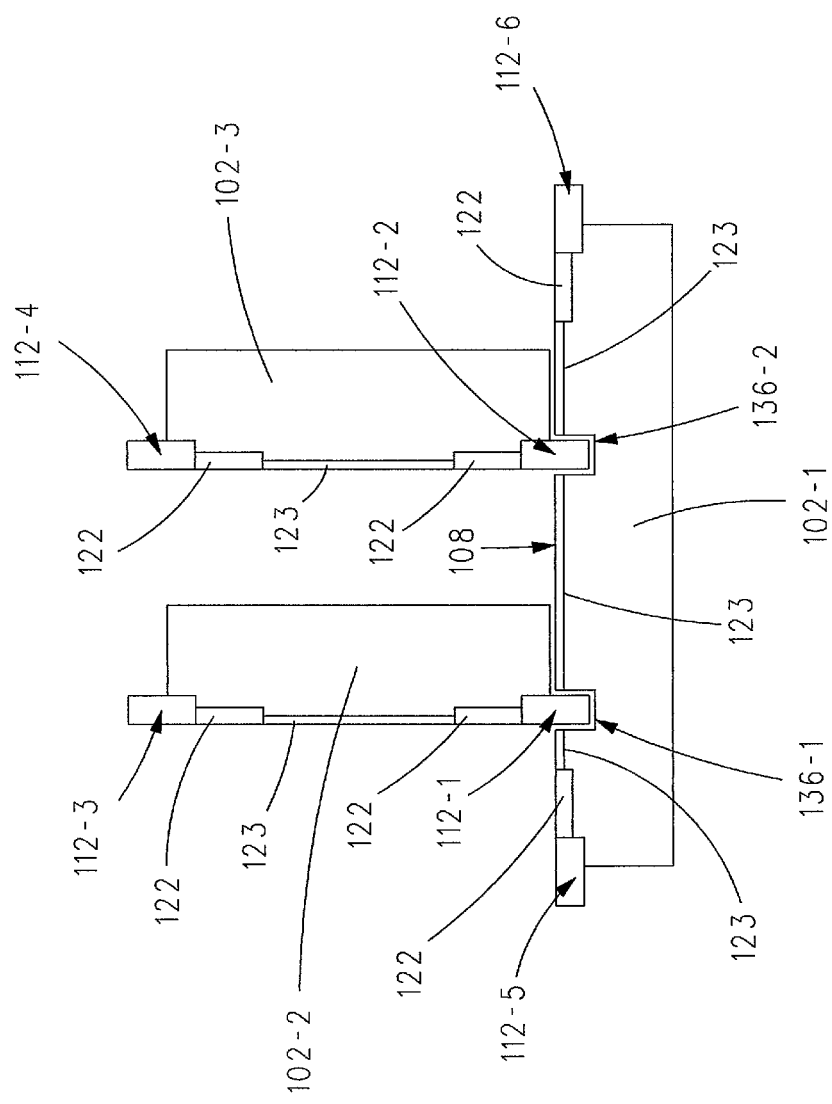
FIG. 7B is a side view of two vertical microchips connected to a horizontal microchip with QP nodules and conductive socket elements, respectively.

With reference to FIG. 7B, in another example multiple microchips 102-1-102-3 are connected via QP nodules 112 and conductive sockets 136. In this example, microchips 102-2 and 102-3 can be connected to microchip 102-1 by the distal ends of QP nodules 112-1 and 112-2 inserted into conductive sockets 136-1 and 136-2 formed in the top surface 108 of microchip 102-1. QP nodule 112-1 can be electrically connected to one or more I/O pads 122, one or more conductors 123, one or more other QP nodules 112-3, and/or other circuitry of microchips 102-2. QP nodule 112-2 can be electrically connected to one or more I/O pads 122, one or more conductors 123, one or more other QP nodules 112-4, and/or other circuitry of microchips 102-3. Each socket 136-1 and 136-2 can be electrically connected to one or more I/O pads 122, one or more conductors 123, one or more QP nodules 112-5 and 112-6 of microchip 102-1, and or other circuitry of microchip 102-1. QP nodules 112-1 and 112-2 inserted into sockets 136-1 and 136-2, respectively, can create one or more electrical connections between any combination of microchips 102-1, 102-2 and 102-3. Any combination of microchips with QP nodules 112 connected with conductive sockets 136 is envisioned.

Figure 7C:
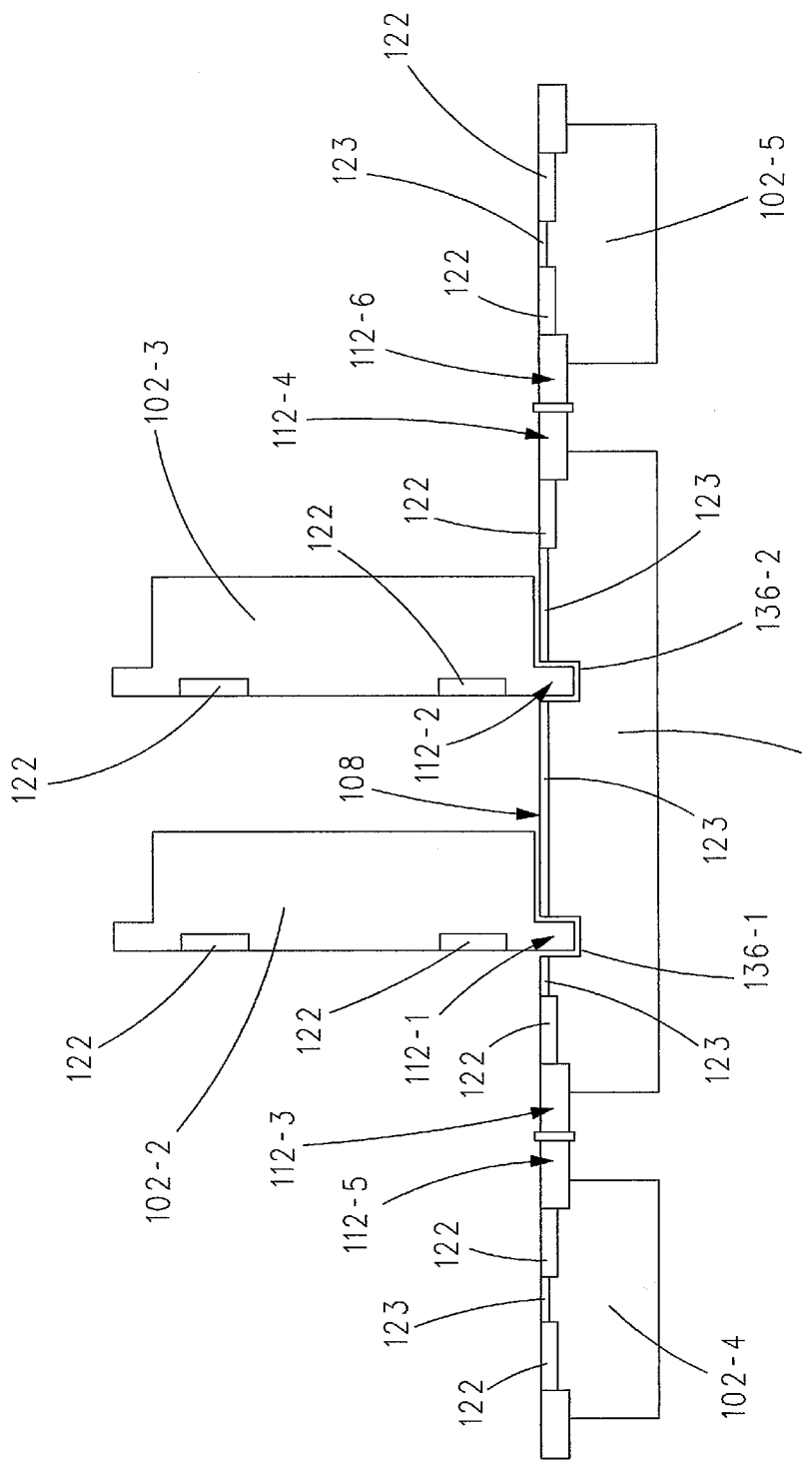
FIG. 7C is a side view of two vertical microchips connected to a central horizontal microchip with QP nodules and conductive socket elements, respectively, wherein opposite sides of the central microchip are each connected to a microchip with QP nodules.

With reference to FIG. 7C, in another example multiple microchips 102 are connected via QP nodules 112 and sockets 136. In this example, microchips 102-1, 102-2 and 102-3 are connected in the manner discussed above in connection with FIG. 7B. Microchips 102-4 and 102-5, including QP nodules 112-5 and 112-6, respectively, are connected at their distal ends to distal ends of QP nodules 112-3 and 112-4, respectively, of microchip 102-1, whereupon electrical and/or mechanical connections between any combination of microchips 102-1, 102-2 and 102-3 can be extended to one or both of microchips 102-4 and 102-5. Any combination of microchips with QP nodules 112 connected with conductive sockets 136 is envisioned.

Figure 8A:
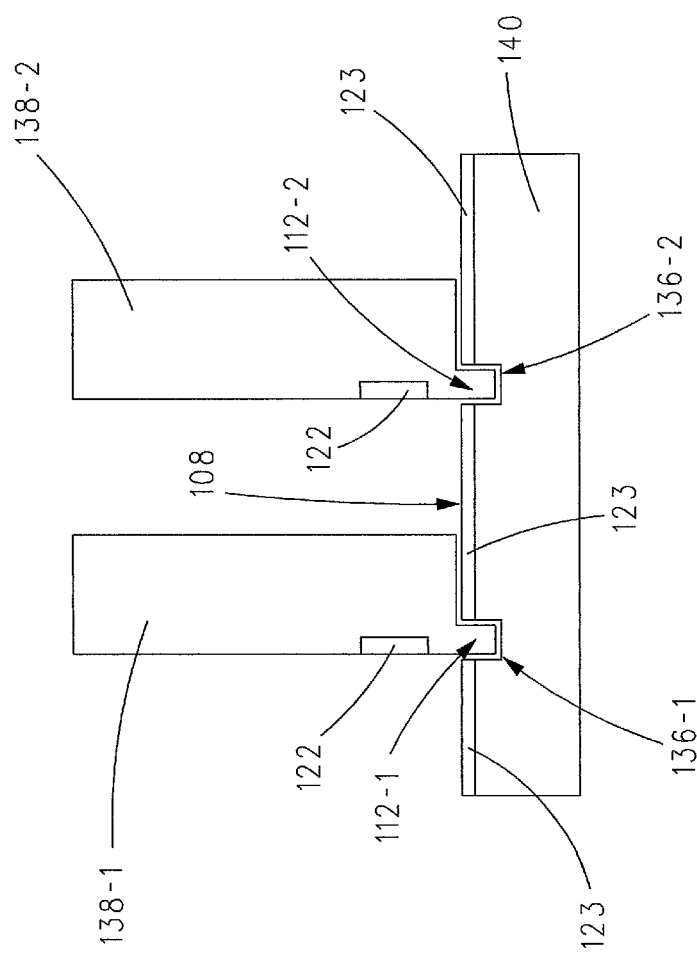
FIG. 8A is a side view of two vertical daughterboard microchips connected with QP nodules and conductive socket elements to a motherboard.

With reference to FIG. 8A, another example shows daughterboard microchips 138-1 and 138-2 connected at the distal ends of QP nodules 112-1 and 112-2 to conductive sockets 136-1 and 136-2 of a motherboard 140 that can include on ore more conductors 123. Motherboard 140 can be a microchip or can be a conventional printed circuit board. Motherboard 140 and daughterboard microchips 138-1 and 138-2 can be fabricated with only the conductive sockets 136 and QP nodules 112 needed for electrical and/or mechanical interconnection to each other. Possible configurations can include any number of motherboard or daughterboard microchips in any three-dimensional arrangement which can provide, for example, thermal conductivity for heat management, can provide multiple functions, can include active or passive circuitry, or can simply be for providing mechanical strength to a system.

Figure 8B:
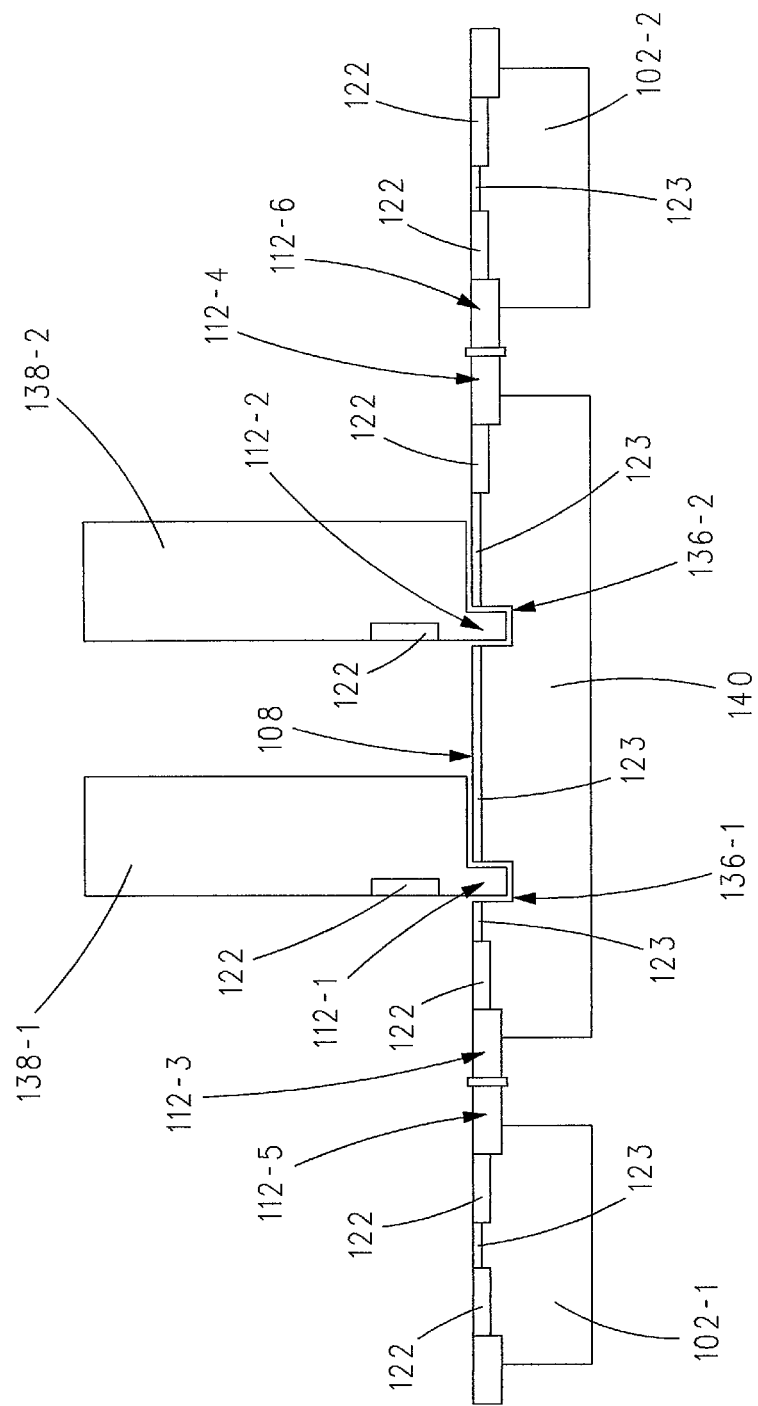
FIG. 8B is a side view of two vertical daughterboard microchips connected with QP nodules and conductive socket elements to a motherboard, wherein opposite sides of the motherboard are each connected to a microchip with QP nodules.

With reference to FIG. 8B, another example shows additional possible combinations of the arrangement of motherboard 140 and daughterboard microchips 138-1 and 138-2 shown in FIG. 8A. In addition to the arrangement of motherboard 140 and daughterboard microchips 138-1 and 138-2 shown in FIG. 8A, microchips 102-1 and 102-2, including QP nodules 112-5 and 112-6, are connected at their distal ends to QP nodules 112-3 and 112-4, respectively, of motherboard 140 whereupon electrical and/or mechanical connections between motherboard 140 and daughterboard microchips 138-1 and 138-2 can be extended to one or both of microchips 102-1 and 102-2. In this example, motherboard 140 further includes I/O pads 122 not shown in the example of FIG. 8A. Possible configurations can include any number of motherboard or daughterboard microchips in any three-dimensional arrangement which can provide thermal conductivity for heat management, can be used to provide multiple functions, can include active or passive circuitry or can simply be for providing mechanical strength to a system.

With reference to FIG. 9A, in another example, microchip 102 includes QP nodules 112 and a castellated guard ring 141 to provide isolation of the functional circuitry within the castellated guard ring from external noise sources. A cross-section of microchip 102 taken along lines IXB-IXB in FIG. 9A is shown in FIG. 9B to illustrate that the castellated guard ring 141 extends through at least a portion of microchip substrate 142 adjacent QP nodules 112. In an example, castellated guard ring 141 can extend through the entire thickness of microchip substrate 142, as shown in FIG. 9B. In another example, the castellated guard ring 141 only extends partially through the entire thickness from the top surface 108 to the bottom surface 110 of microchip 102.

Figure 9C:
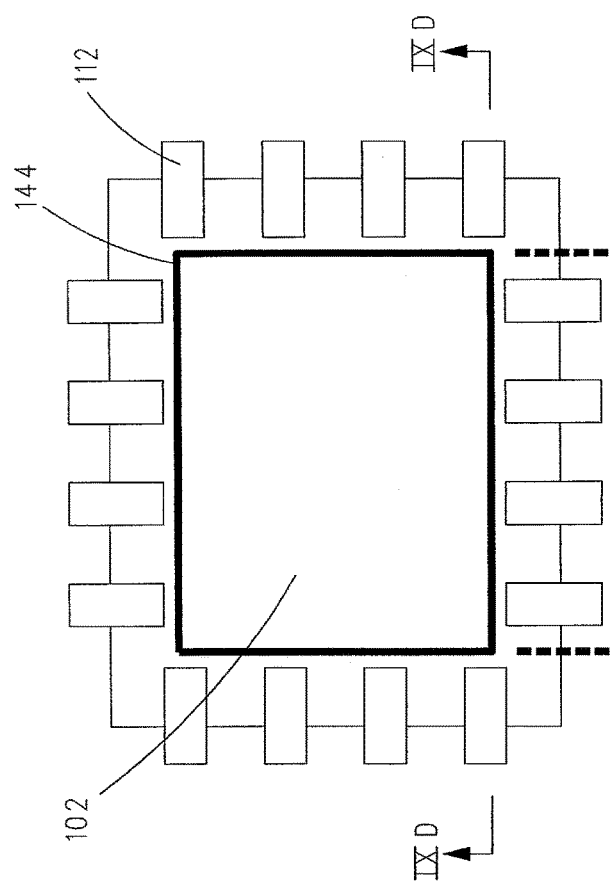
FIG. 9C is a plan view of a microchip with QP nodules including a rectangular guard ring.
Figure 9D:
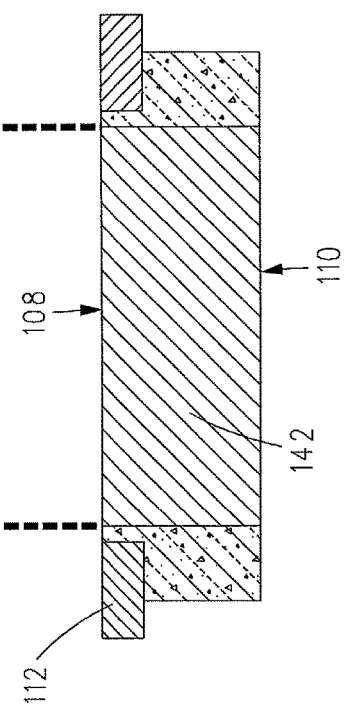
FIG. 9D is a section taken along lines IXD-IXD in FIG. 9C.

With reference to FIG. 9C, in another example, a microchip 102 includes QP nodules 112 and a rectangular guard ring 144 to provide isolation of the functional circuitry from noise sources. A cross-section of microchip 102 taken along lines IXD-IXD in FIG. 9C shows, in FIG. 9D, that the rectangular guard ring 144 can extend through at least a portion of microchip substrate 142 in the area of the QP nodules 112. In an example, rectangular guard ring 144 extends through the entire thickness of microchip substrate 142. In another example, the rectangular guard ring 144 extends only partially through the entire thickness from the top surface 108 to the bottom surface 110 of microchip 102.

Figure 10:
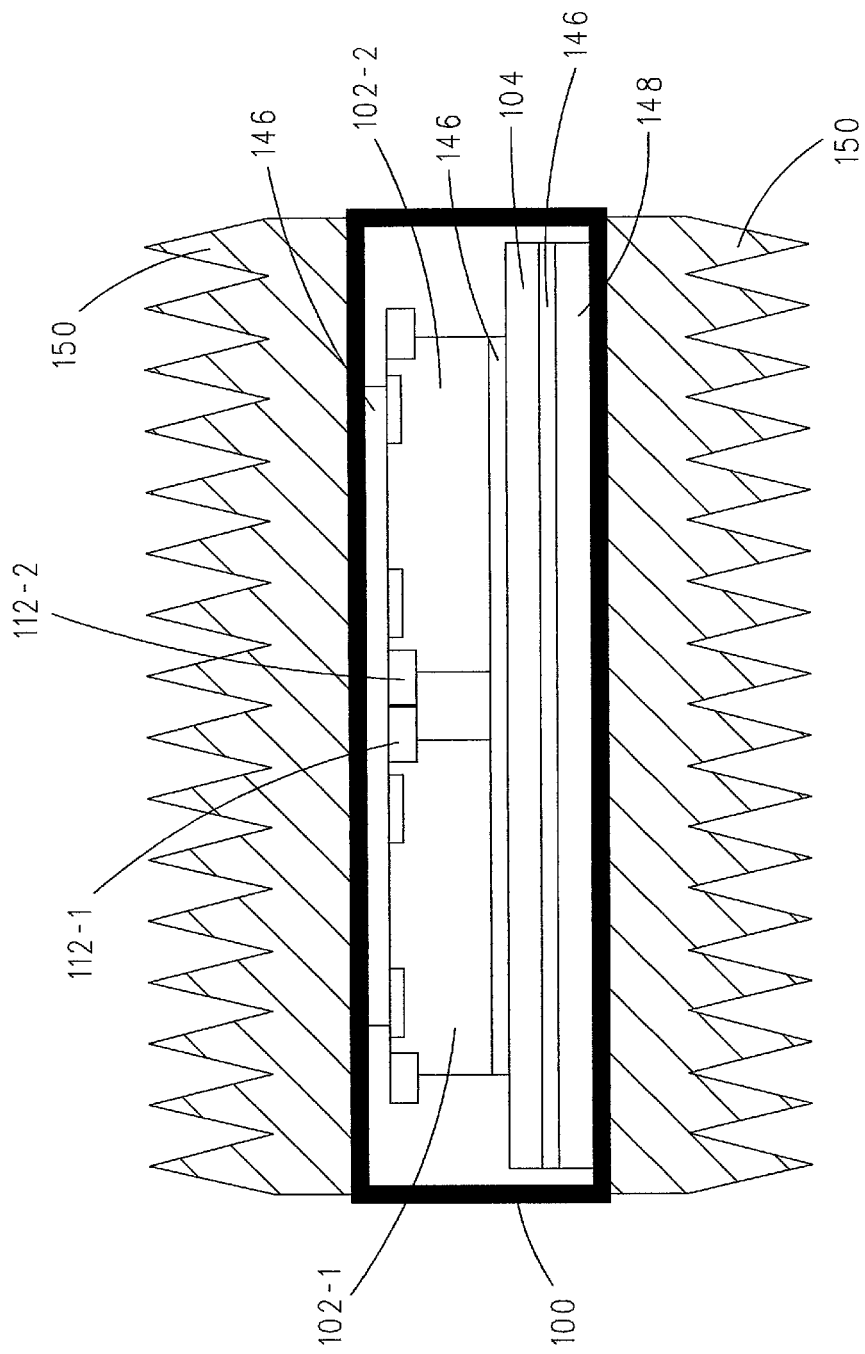
FIG. 10 is a section of an enclosed package showing a side view of two microchips connected with QP nodules connected to a package substrate with thermal adhesive, wherein the package substrate is connected to a base plate via an adhesive, wherein heat sinks are disposed on the top and bottom exterior surfaces of the package.

With reference to FIG. 10, in another example, microchips 102-1 and 102-2 are connected via QP nodules 112-1 and 112-2, respectively, inside an enclosed package 100. Package 100 includes package substrate 104, thermal adhesive 146, a base plate 148 in the interior of package 100 and heat sinks 150 on the top and bottom exterior surfaces of package 100. This illustrates an example of dual sided cooling that can be possible for integrated circuit packages that include microchips coupled together via QP nodules. However, the example shown in FIG. 10 is not to be construed as limited to just two microchips inside a package or to the particular configuration of materials between microchips 102-1 and 102-2 and heat sinks 150. The thermal adhesive 146 can provide a means of transferring heat out of microchips 102-1 and 102-2 and/or to attach each microchip 102 to the package 100 or package substrate 104. Base plate 148 can be comprised of copper or other thermally conductive material. Package 100 can be comprised of ceramic or molded plastic. Heat sinks 150 can partially or wholly encase package 100 and other means of thermal conduction can be employed to remove heat from package 100.

Figure 11A:
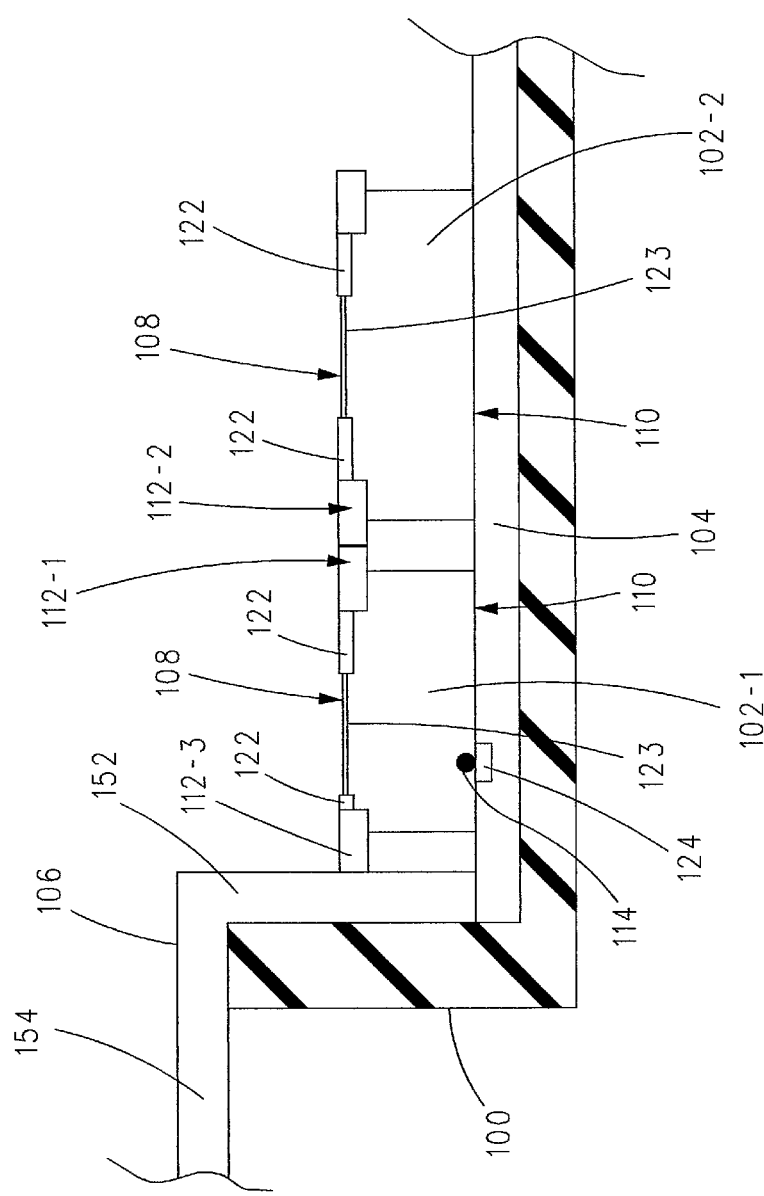
FIG. 11A is a section of an isolated portion of a microchip package showing a side view of two microchips connected via QP nodules, wherein one microchip is directly connected to a package level I/O terminal via a QP nodule.

With reference to FIG. 11A, in another example microchip 102-1 with QP nodules 112-1 and 112-3 is connected directly to a package-level I/O terminal 106. In this example, microchips 102-1 and 102-2 are shown inside package 100 and are connected to each other via QP nodules 112-1 and 112-2. Microchip 102-1 is further connected directly to package-level I/O terminal 106 via the distal end of QP nodule 112-3 coupled to the surface I/O terminal 106. More specifically, the distal end of QP nodule 112-3 is electrically connected to the surface of a vertical portion 152 of I/O terminal 106 inside of package 100. I/O terminal 106 can have a horizontal portion 154 that extends outside of package 100 for electrical connection to an external conductor (not shown). Package-level I/O terminal 106 can be copper, other conductive material or a flexible ribbon or stranded assembly, all of which are known in the art. QP nodule 112-3 can be coupled to package-level I/O terminal 106 by soldering, solder reflow, thermal compression or other means. Package-level I/O terminal 106 can be included in package 100 at any suitable and/or desired time. Although two microchips 102 are shown, it is envisioned that one or more than two microchips with QP nodules 112 can be included in package 100.

Electrical signals from microchip 102-1 can be routed or coupled to or between one or more I/O pads 122 on the top surface 108 via one or more conductors 123 to QP nodule 112-1 for further routing or coupling to QP nodule 112-2 on microchip 102-2, and/or to QP nodule 112-3 for further routing or coupling to package-level I/O terminal 106. Electrical signals from microchip 102-1 can also or alternatively be routed or coupled through one or more optional bottom surface connectors 114 to one or more package level I/O terminals 106 (shown best in FIG. 1) via one or more I/O conductors 124 in a manner known in the art.

Figure 11B:
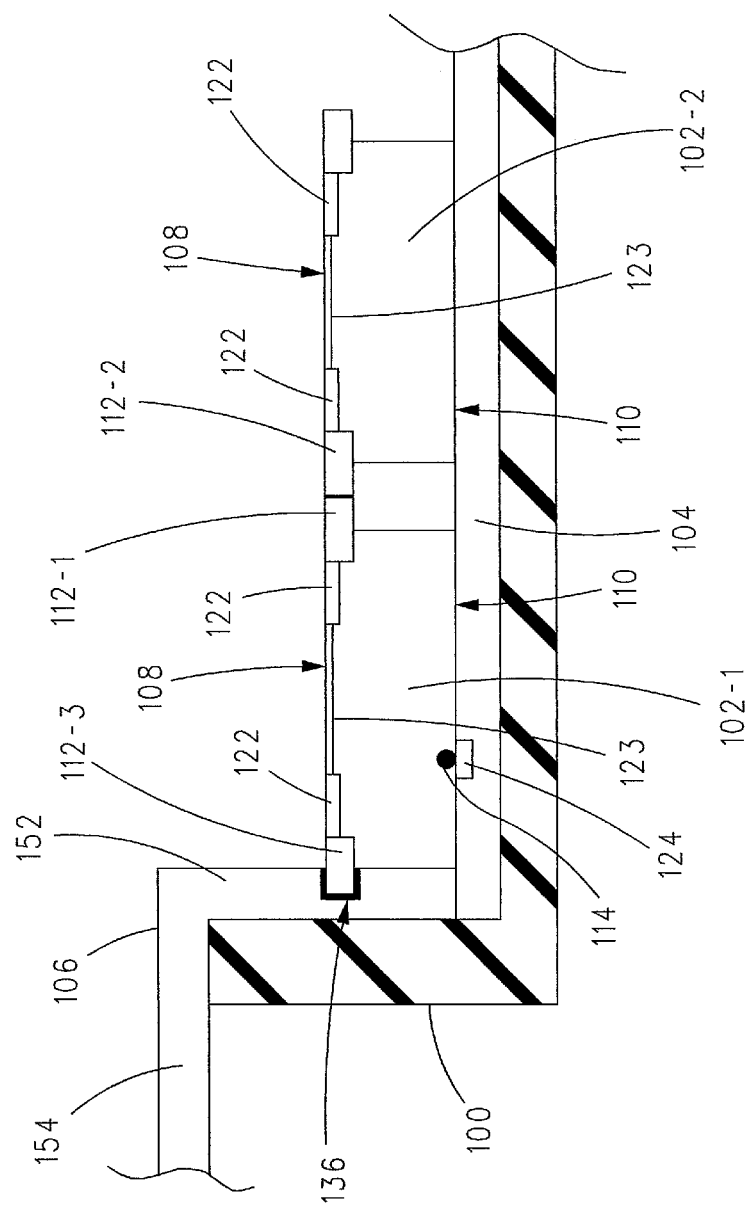
FIG. 11B is cross-section of an isolated portion of a microchip package showing a side view of two microchips connected via QP nodules, wherein one microchip is directly connected to a package level I/O terminal via a QP nodule inserted into a conductive socket formed in the package-level I/O terminal.

With reference to FIG. 11B, in another example, microchip 102-1 with QP nodules 112-1 and 112-3 is connected to a package-level I/O terminal 106. In this example, a conductive socket or notch 136 formed in package-level I/O terminal 106 can be lined with solder or solder paste and then reflowed once QP nodule 112-3 is inserted into socket 136. Although two microchips 102 are shown, it is envisioned that one or more than two microchips with QP nodules 112 can be included in package 100. This example is similar to the example shown in FIG. 11A with the exception that QP nodule 112-3 is received in conductive socket or notch 136 in the vertical portion 152 of package-level I/O terminal 106.

Electrical signals from microchip 102-1 can be routed or coupled to or between one or more I/O pads 122 on the top surface 108 via one or more conductors 123 to QP nodule 112-1 for further routing or coupling to QP nodule 112-2 on microchip 102-2, and/or to QP nodule 112-3 which can be further coupled to a package-level I/O terminal 106 via, for example, one or more additional conductive sockets 136 in contact with the surface of a package-level I/O terminal 106 in the manner shown in FIG. 11A. Electrical signals from microchip 102-1 can also or alternatively be routed or coupled through one or more optional bottom surface connectors 114 to one or more package level I/O terminals 106 (shown best in FIG. 1) via one or more I/O conductors 124 in a manner known in the art.

In FIGS. 11A-11B, it is envisioned that multiple instances of QP nodules 112-3 can be coupled to the surface of multiple package-level I/O terminals 106 (FIG. 11A), or to multiple instances of conductive sockets 136 (FIG. 11B), or to some combination of the surface of one or more package-level I/O terminals 106 and to one or more conductive sockets 136 of said one or more package-level I/O terminals 106.

The embodiments have been described with reference to various examples. Modifications and alterations will occur to others upon reading and understanding the foregoing examples. Accordingly, the foregoing examples are not to be construed as limiting the disclosure. For instance, any microchip 102 with QP nodules 112 can include or comprise any one or combination of active circuit elements, passive circuit elements, or semiconductor devices such as operational amplifiers, transistors (BJT, JFET, IGFET, MOSFET, IGBT, etc), resistors, capacitors, and inductors, any of which may be in vertical or planar form, may have electrical connections along and/or through the top and/or bottom surfaces of the microchip, may have conductor patterns formed on the surfaces of and/or in the microchip to facilitate electrical connections, and may be included in leaded or surface mount packaging made of glass, metal, ceramic or plastic, or other known and unknown materials.

The invention claimed is:

1. An integrated circuit packaging system comprising:
   first and second microchips, each microchip comprising:
      a top surface;
      a bottom surface;
      one or more quilt package nodules fabricated on said top surface; and
      one or more bottom surface connectors;
   and
   a substrate including a recess defining a bottom surface on which the first and second microchips are mounted, the substrate having a terminal including a planar vertical portion that extends away from the bottom surface of the recess along a planar side surface of the recess and a horizontal portion that extends from an end of the planar vertical portion of the terminal opposite the bottom surface of the recess away from the recess;
   wherein:
   the first and second microchips are connected via the quilt package nodules;

a distal end of at least one quilt package nodule is connected to the planar vertical portion of the terminal between the horizontal portion of the terminal and the bottom surface of the recess; and the distal end of the at least one quilt package nodule is spaced from the planar side surface of the recess by at least a portion of the planar vertical portion of the terminal.

2. The system of claim 1, further comprising one or more wirebonds extending from the top surface of at least one of the microchips to the substrate.

3. The system of claim 1, further comprising at least one circuit element that extends from the top surface to at least one of the bottom surface connectors of the first microchip.

4. The system of claim 3, further comprising at least one circuit element that extends from the top surface to at least one of the bottom surface connectors of the second microchip.

5. The system of claim 4, further comprising a third microchip connected via quilt package nodules to at least one of the first and second microchips, the third microchip having at least one circuit element that extends from a top surface to at least one bottom surface connector of the third microchip.

6. The system of claim 3, further comprising the second microchip comprising at least one planar circuit element.

7. The system of claim 6, further comprising a third microchip connected via quilt package nodules to at least one of the first and second microchips, the third microchip comprising a planar circuit element, or a circuit element that extends from a top surface to at least one bottom surface connector of the third microchip, or both a planar circuit element and a circuit element that extends from the top surface to at least one bottom surface connector of the third microchip.

8. The system of claim 1, where the substrate comprises an integrated circuit package.

9. The system of claim 1, wherein the distal end of the at least one quilt package nodule is connected to a surface of the planar vertical portion of the terminal.

10. The system of claim 1, wherein the distal end of the at least one quilt package nodule is inserted into a socket of the planar vertical portion of the terminal.

11. An integrated circuit packaging system comprising:
a microchip comprising:
a top surface;
a bottom surface;
one or more quilt package nodules fabricated on said top surface;
one or more bottom surface connectors;
and
a substrate including a recess in which the microchip is mounted on a bottom surface of the recess, wherein the substrate includes a terminal including a planar vertical portion, that extends from the bottom surface of the recess toward a horizontal portion of the terminal along a planar surface of the recess, to which the microchip is connected via a quilt package nodule of the microchip, wherein a distal end of the quilt package nodule is connected to the planar vertical portion of the terminal between the horizontal portion of the terminal and the bottom surface of the recess, and the distal end of the quilt package nodule is spaced from the planar surface of the recess by at least a portion of the planar vertical portion of the terminal.

12. The system of claim 11, further comprising one or more wirebonds extending from the top surface of the microchip to the substrate.

13. The system of claim 11, further comprising at least one circuit element that extends from the top surface to the bottom surface of the microchip.

14. The system of claim 13, further comprising at least one planar circuit element that extends along the top surface of the microchip.

15. The system of claim 14, further comprising a second microchip connected via quilt package nodules to the microchip, the second microchip comprising a planar circuit element, or a circuit element that extends from a top surface to at least one bottom surface connector of the second microchip, or both a planar circuit element and a circuit element that extends from the top surface to at least one bottom surface connector of the second microchip.

16. An integrated circuit packaging system comprising:
a microchip comprising:
a top surface;
a bottom surface;
one or more quilt package nodules fabricated on said top surface;
one or more bottom surface connectors;
and
a substrate including a recess in which the microchip is mounted on a bottom surface of the recess, wherein the substrate includes a terminal including a planar vertical portion, that extends from the bottom surface of the recess toward a horizontal portion of the terminal along a planar surface of the recess, to which the first microchip is connected via a quilt package nodule of the first microchip, wherein a distal end of the quilt package nodule is inserted into a notch or socket in the planar vertical portion of the terminal between the horizontal portion of the terminal and the bottom surface of the recess, and the distal end of the quilt package nodule is spaced from the planar surface of the recess by at least a portion of the planar vertical portion of the terminal.

17. The system of claim 16, further comprising one or more wirebonds extending from the top surface of the microchip to the substrate.

18. The system of claim 16, further comprising at least one circuit element that extends from the top surface to the bottom surface of the microchip.

19. The system of claim 18, further comprising at least one planar circuit element that extends along the top surface of the microchip.

20. The system of claim 19, further comprising a second microchip connected via quilt package nodules to the first microchip, the second microchip comprising a planar circuit element, or a circuit element that extends from a top surface to at least one bottom surface connector of the second microchip, or both a planar circuit element and a circuit element that extends from the top surface to at least one bottom surface connector of the second microchip.

* * * * *